(12) United States Patent
Asakawa et al.

(10) Patent No.: US 11,393,671 B2
(45) Date of Patent: Jul. 19, 2022

(54) METHOD OF FORMING PATTERN AND METHOD OF MANUFACTURING SEMICONDUCTOR DEVICE

(71) Applicant: Kioxia Corporation, Tokyo (JP)

(72) Inventors: Koji Asakawa, Kawasaki Kanagawa (JP); Norikatsu Sasao, Kawasaki Kanagawa (JP); Shinobu Sugimura, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 315 days.

(21) Appl. No.: 16/816,478

(22) Filed: Mar. 12, 2020

(65) Prior Publication Data
US 2021/0082693 A1    Mar. 18, 2021

(30) Foreign Application Priority Data
Sep. 18, 2019   (JP) .............................. JP2019-169871

(51) Int. Cl.
*H01L 21/02*   (2006.01)
*H01L 21/3105*   (2006.01)
*H01L 21/311*   (2006.01)

(52) U.S. Cl.
CPC .. *H01L 21/02118* (2013.01); *H01L 21/02323* (2013.01); *H01L 21/31058* (2013.01); *H01L 21/31144* (2013.01)

(58) Field of Classification Search
CPC .......... H01L 21/02118; H01L 21/02323; H01L 21/31058; H01L 21/31144
(Continued)

(56) References Cited

U.S. PATENT DOCUMENTS 9,487,600 B2   11/2016   Darling et al.
2010/0273014 A1*   10/2010   Ueki ..................... H05K 3/181
                                                                       428/457
(Continued)

FOREIGN PATENT DOCUMENTS

JP   2001-310331 A   11/2001
JP   2017-69461 A    4/2017
(Continued)

OTHER PUBLICATIONS

Asakawa et al., "Absorption mechanism of metal precursors in resist polymer for improving etch resistance," Microprocess and Nanotechnology Conference, 15A-4-3 (2018), 2 pages.
(Continued)

*Primary Examiner* — David Vu
*Assistant Examiner* — Brandon C Fox
(74) *Attorney, Agent, or Firm* — Finnegan, Henderson, Farabow, Garrett & Dunner L.L.P.

(57) ABSTRACT

A method of forming an organic film according to one embodiment, includes: forming an organic film on a substrate with a pattern forming material; patterning the organic film to form a patterned film; and supplying a precursor of a metallic compound to the patterned film to form a mask pattern. The material contains a polymer having a side chain including an unshared electron pair and a group having oxidation activity to the precursor. The group includes at least one group selected the group consisting of a carboxyl group, a hydroxyl group, a sulfo group, and a nitro group. An average number of the group per monomer unit is 0.3 or more. The metallic compound contains a metal with an atomic number of 22 or more in group 3 elements to group 13 elements.

8 Claims, 7 Drawing Sheets

(58) Field of Classification Search
USPC .......................................................... 438/780
See application file for complete search history.

(56) References Cited

U.S. PATENT DOCUMENTS

| | | |
|---|---|---|
| 2018/0017872 A1 | 1/2018 | Nihashi et al. |
| 2018/0120705 A1 | 5/2018 | Nihashi et al. |
| 2019/0086803 A1 | 3/2019 | Asakawa et al. |
| 2020/0006076 A1 | 1/2020 | Sasao et al. |

FOREIGN PATENT DOCUMENTS

| | | | |
|---|---|---|---|
| JP | 6410926 | B2 | 10/2018 |
| JP | 6427670 | B2 | 11/2018 |

OTHER PUBLICATIONS

Cianci et al., "Trimethyaluminum Diffusion in PMMA Thin Films during Sequential Infiltration Synthesis: In Situ Dynamic Spectroscopic Ellipsometric Investigation," Adv. Mater. Interfaces, vol. 5:1801016 (2018), 10 pages.

Sigmund, "Theory of Sputtering. I. Sputtering Yield of Amorphous and Polycrystalline Targets," Physical Review, vol. 184, No. 2, pp. 383-416 (Aug. 10, 1969).

Kinbara, "Sputtering phenomenon," University of Tokyo Press, pp. 14-17 (1984).

Oechsner, "Sputtering of Polycrystalline Metal Surfaces at Oblique Ion Bombardment in the 1keV Range," Z. Physik, vol. 261, pp. 37-58 (1973).

* cited by examiner

METHOD OF FORMING PATTERN AND METHOD OF MANUFACTURING SEMICONDUCTOR DEVICE

CROSS-REFERENCE TO RELATED APPLICATION

This application is based upon and claims the benefit of priority from Japanese Patent Application No. 2019-169871, filed on Sep. 18, 2019; the entire contents of which are incorporated herein by reference.

FIELD

Embodiments relate to a method of forming a pattern and a method of manufacturing a semiconductor device.

BACKGROUND

In steps of manufacturing a semiconductor device, a demand for a technique of forming a pattern having a high aspect ratio is increasing. A mask pattern to be used for such steps is exposed to an etching gas for a long time, to thus be required to have high etch resistance.

DETAILED DESCRIPTION

Figure 1A:
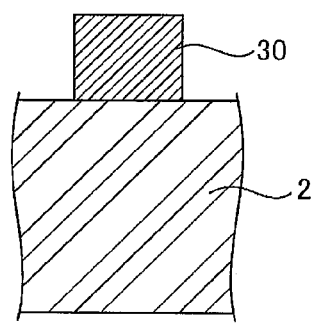
FIG. 1A is a cross-sectional view for explaining shoulder-drop of a mask pattern.

A method of forming an organic film according to one embodiment, includes: forming an organic film on a substrate with a pattern forming material; patterning the organic film to form a patterned film; and supplying a precursor of a metallic compound to the patterned film to form a mask pattern. The material contains a polymer having a side chain including an unshared electron pair and a group having oxidation activity to the precursor. The group includes at least one group selected the group consisting of a carboxyl group, a hydroxyl group, a sulfo group, and a nitro group. An average number of the group per monomer unit is 0.3 or more. The metallic compound contains a metal with an atomic number of 22 or more in group 3 elements to group 13 elements.

Hereinafter, the present invention will be explained in detail with reference to the drawings. The present invention is not limited by the following embodiment. Further, components in the following embodiment include ones easily assumed by those skilled in the art or ones substantially the same ones.

The drawings are schematic or conceptual, and a relation between thickness and width of each part, a size ratio among the parts, and so on are not necessarily the same as actual ones. Even when the same part is illustrated, its size and ratio are sometimes differently illustrated in the drawings. In the specification of the present application and the drawings, the same elements as those previously described in a drawing already referred to are denoted by the same reference numerals and symbols, and detailed explanations thereof will be omitted when appropriate.

A polymer is a polymer formed by polymerization of a monomer, and is composed of repeating units derived from the monomer. In this specification, the repeating unit composing the polymer is referred to as a monomer unit (segment). The monomer unit is a unit derived from the monomer, and a component monomer of the monomer unit is a monomer forming the monomer unit by polymerization.

Infiltrating an organic film with a metallic compound is referred to as "metallization." In this embodiment, a metal-containing organic film obtained by metallization, (which is what is called an organo-metallic composite film and will also be referred to as a "composite film" hereafter), is used as a mask pattern. Concretely, the metallization can be performed by coordinating a precursor of a metallic compound that is present in a composite film finally (to be also referred to as a "precursor" hereafter) to, of the organic film having a site where the precursor can be coordinated, the side and then oxidizing the precursor. "Oxidation" means loss of electrons of a metallic atom to form a different stable chemical compound like oxide, hydroxide, and halide.

In consideration of the above-described problem, the present inventors examined a forming method of a mask pattern made of the above-described composite film by aiming to obtain a mask pattern having high etch resistance and enable a reduction in occurrence of shoulder-drop at an etching time in the obtained mask pattern in particular. As a result, they found out that the metal of the metallic compound is set to a metal with an atomic number of 22 or more in group 3 elements to group 13 elements and the polymer contained in the organic film is set to a polymer having oxidation active group for a precursor, to thereby solve the above-described problem.

Figure 1B:
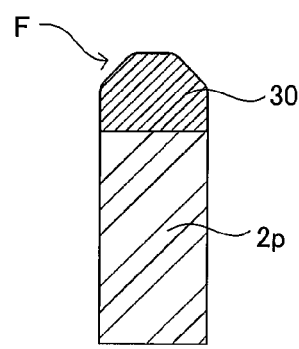
FIG. 1B is a cross-sectional view for explaining shoulder-drop of a mask pattern.

The shoulder-drop is a phenomenon to occur when a target film is processed by etching or the like by using a mask pattern. FIG. 1A and FIG. 1B illustrate cross-sectional views before and after shoulder-drop occurs in the mask pattern. FIG. 1A illustrates a state where a mask pattern 30 is formed on a target film 2. FIG. 1B illustrates a state where the target film 2 has been processed by etching by using the mask pattern 30 as a mask. In FIG. 1B, the mask pattern 30 is in a state where upper side corner portions in cross section are chipped, and such a state is a state where shoulder-drop F has occurred. It is problematic because the occurrence of the shoulder-drop in the mask pattern causes a decrease in dimensional accuracy of the target film. This embodiment is that the polymer and the metal in the composite film are combined as above, to thereby suppress the occurrence of the shoulder-drop.

[Method of Forming a Pattern]

The method in the embodiment includes the following steps (1) to (3).

Step (1): A step of forming an organic film on a substrate with a pattern forming material Step (2): A step of patterning the organic film obtained in the step (1)

Step (3): A step of supplying a precursor of a metallic compound (a precursor) to the patterned film In the method in the embodiment, the pattern forming material used in the step (1) contains a polymer having an unshared electron pair (lone pair) and oxidation active group for the precursor (to be also referred to as a "group having oxidation activity" simply hereafter) at a side chain. The group having oxidation activity that the polymer has is made of at least one selected from a carboxyl group, a hydroxyl group, a sulfo group, and a nitro group. In the polymer, the average number of pieces of the group having oxidation activity per monomer unit is 0.3 or more. The polymer having an unshared electron pair and the above-described group having oxidation activity at a side chain, in which the average number of pieces of the group having oxidation activity per monomer unit is 0.3 or more, is also referred to as a polymer (X) hereafter.

By the step (3), the organic film is infiltrated with the precursor, and the precursor is coordinated to the unshared electron pair that the organic film has and then is oxidized to be the metallic compound. The oxidation of the precursor is performed to some extent by the group having oxidation activity to the polymer (X). Further, after the step (3), as a step (4), a step of supplying an oxidant to the organic film may be provided arbitrarily to oxidize the precursor. The oxidation of the precursor may be performed spontaneously by moisture in an atmosphere without operation in particular. Thereby, the mask pattern made of the composite film in which the organic film containing the polymer (X) is infiltrated with the metallic compound is obtained.

Further, the metal of the metallic compound in the method in the embodiment is a metal with an atomic number of 22 or more in group 3 elements to group 13 elements. That is, the metal contained in the precursor is the metal with an atomic number of 22 or more in group 3 elements to group 13 elements.

FIG. 2A to FIG. 2F are views illustrating one example of the method according to the embodiment in the order of steps. The example is an example including the step (1) to the step (4). Further, in this example, as the substrate, a substrate 10 having the target film 2 on a semiconductor substrate 1 is used.

Figure 2A:
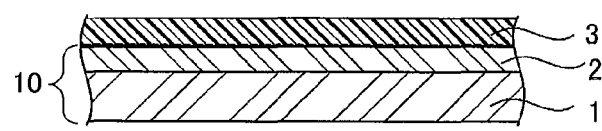
FIG. 2A is views illustrating one example of a method of forming a pattern according to an embodiment.
Figure 2B:
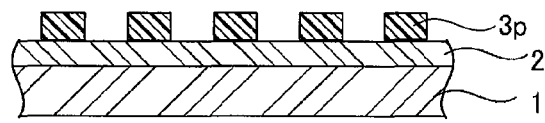
FIG. 2B is views illustrating one example of a method of forming a pattern according to an embodiment.
Figure 2C:
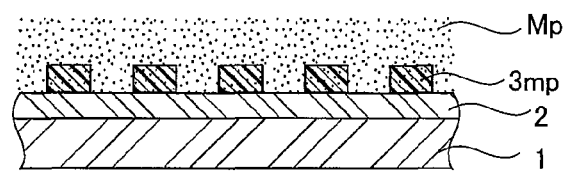
FIG. 2C is views illustrating one example of a method of forming a pattern according to an embodiment.
Figure 2D:
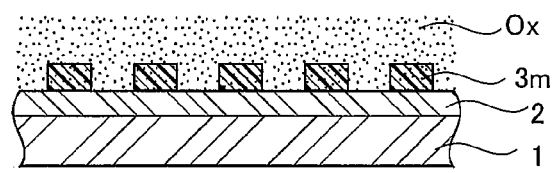
FIG. 2D is views illustrating one example of a method of forming a pattern according to an embodiment.
Figure 2E:
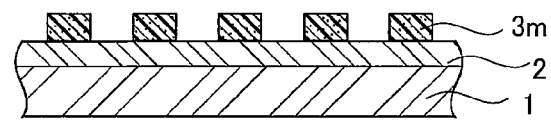
FIG. 2E is views illustrating one example of a method of forming a pattern according to an embodiment.
Figure 2F:
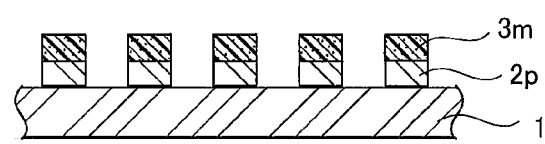
FIG. 2F is views illustrating one example of a method of forming a pattern according to an embodiment.

FIG. 2A illustrates a cross-sectional view of a stack in which an organic film 3 is formed on the target film 2 on the substrate 10 after the step (1). FIG. 2B illustrates a cross-sectional view illustrating a state where an organic film pattern 3p is stacked on the target film 2 on the substrate 10 after the step (2). FIG. 2C and FIG. 2D illustrate the step (3) and the step (4) respectively. FIG. 2E is a cross-sectional view illustrating a state where a mask pattern made of a composite film 3m is formed on the target film 2 on the substrate 10. FIG. 2F illustrates a state where the target film 2 is processed through a mask pattern 3m. The step (1) to the step (4) in the method in the embodiment will be explained below while referring to FIG. 2A to FIG. 2F.

Step (1)

The step (1) is a step of forming the organic film 3 on the target film 2 on the substrate 10 illustrated in the cross-sectional view in FIG. 2A with the pattern forming material containing the polymer (X).

[Pattern Forming Material]

The pattern forming material contains the polymer (X). The organic film 3 obtained with the pattern forming material may consist of the polymer (X), may consist of the polymer (X) and other solid contents, or may consist of a crosslinked product obtained by crosslinking the polymers (X). Furthermore, the organic film 3 may consists of the crosslinked product and other solid contents. In the case where the organic film 3 contains the crosslinked product of the polymer (X), the unshared electron pair and the group having oxidation activity that the polymer (X) has at a side chain exist as they are in the crosslinked product.

(Polymer (X))

The polymer (X) has an unshared electron pair and oxidation active group at a side chain. In the polymer (X), 0.3 pieces or more of the groups having oxidation activity exist per monomer unit on average. For example, in the case where the polymer (X) is a copolymer of a monomer having a single group having oxidation activity and a monomer having no group having oxidation activity, 30 mol % or more to all the monomer units composing the polymer (X) are the monomer unit having the group having oxidation activity. Further, in the case where the polymer (X) is a copolymer of a monomer having two groups having oxidation activity and a monomer having no group having oxidation activity, 15 mol % or more to all the monomer units composing the polymer (X) are the monomer unit having the group having oxidation activity.

The polymer (X) has 0.3 or more pieces of the groups having oxidation activity per monomer unit on average, thereby making it possible to increase a later-described degree of metallization. In the polymer (X), 0.5 or more pieces of the groups having oxidation activity are preferred to exist per monomer unit on average.

The maximum of the average number of pieces of the group having oxidation activity to the polymer (X) per monomer unit is preferably about 0.9 and more preferably 0.8 from the viewpoints of diffusion of the precursor and dry etch resistance.

The polymer (X) has the unshared electron pair at a side chain, thereby enabling coordination of the precursor. This phenomenon is a general phenomenon, and when an atom having the unshared electron pair exists in the polymer, the precursor is adsorbed and stabilized. The present inventors found out that there is a positive correlation between a stabilization energy ($\Delta E$) found by a density functional theory (DFT) calculation at that time and the degree of metallization obtained by experiments (K. Asakawa, et al., Microprocess and Nanotechnology Conference, 15A-4-3, 2018).

The degree of metallization is a degree to which the organic film adsorbs metallic elements and immobilize them (metallization), and can be evaluated by using a difference in film thickness between the organic film before the metallization and the organic film after the metallization as an index, for example. A higher degree of metallization makes it possible to obtain a composite film having higher etch resistance.

The film thicknesses of the organic film before and after the metallization are measured by using an atomic force microscope (AFM), and the difference between the film thickness before the metallization and the film thickness after the metallization is set as a metallization amount. There is a slight argument in a definition of this metallization amount using a change amount of the film thickness, but, for example, in the case of the precursor being trimethylaluminum (TMA), the metallization amount is conceived to be quantitative as the content after the precursor is oxidized and changed into aluminum hydroxide or aluminum oxide (E. Cianci, et al., Adv. Mater. Interfaces, vol. 5, 1801016, 2018).

The degree of metallization of the organic film can also be measured by quantifying a metal atomic weight derived from the precursor by X-ray photoelectron spectroscopy (XPS). A correlation between the degree of metallization and the change by the film thickness is verified.

The metal contained in the precursor used in the method in the embodiment is a metal with an atomic number of 22 or more in group 3 elements to group 13 elements, the metal being also referred to as a "metal M" hereafter, and makes it possible to reduce the occurrence of the shoulder-drop in the obtained mask pattern as compared to the case where a metal with an atomic number of 21 or less is used. In the meantime, the metal M is difficult to be oxidized. Even though a precursor containing the metal M (to be also referred to as a "precursor Mp" hereafter) is coordinated to the unshared electron pair that the organic film 3 has after the organic film 3 is infiltrated with the precursor containing the metal M, the precursor is desorbed from the organic film 3 unless it is oxidized. Therefore, the polymer (X) contains the group having oxidation activity at a side chain at a predetermined ratio in order to promote oxidation of the precursor Mp in the organic film 3.

The present inventors has found that there has been so far a problem that the shoulder-drop occurs in the mask pattern of the composite film as illustrated in FIG. 1B depending on the metal contained in the precursor.

The shoulder-drop is a phenomenon in which when accelerated ions hit the mask pattern at the time of etching, shoulder portions of the pattern are shaved because an etching rate at the shoulder portion of the pattern is fast. When a process with a high aspect ratio is required in a three-dimensional device or the like, in particular, the shoulder-drop becomes a very serious problem. As a result of an earnest examination into the reason for this problem, they found out that the shoulder-drop occurs when effect of physical etching increase at the time of etching by highly accelerated ions having high energy.

As a result that the mechanism of reactive ion etching (RIE) is decomposed, the mechanism is mainly composed of three factors of a chemical reaction with oxygen, a chemical reaction with halogen, and sputtering by physical collision of high energy particles.

The improvement in the etch resistance by a metallization technique, which has been examined until now, reveals that measures such as an improvement in oxygen resistance achieved by flame resisting by metal introduction and an improvement in halogen resistance achieved by increasing a composition ratio of carbon to oxygen in resin (an Ohnish parameter) become effective. However, the shoulder-drop often becomes worse by the metallization, which requires a solution.

The sputtering mechanism can be explained by cascade theory revealed theoretically by Sigmund, et al. (Sigmund, Physical Review, 184, 383, 1969). It is an interatomic bond energy that has a high correlation with a sputtering rate among physical properties of a material to be sputtered at this time. Even if ions are incident with energy lower than the bond energy, the sputtering does not occur (threshold energy). Further, it has been known that a higher sputtering yield is obtained by ions that are incident in the tangential direction (high angle) as compared to ions that are incident in the normal direction (low angle). As a result, the etching rate in shoulder portions of a rectangular pattern is accelerated and the shoulder portions are shaved first. This phenomenon becomes more noticeable when the acceleration of ions increases.

It has been known that sputtering yields of materials to be sputtered are arranged according to elements to reveal that the sputtering yields correlate with the periodic table (KINBARA Akira, Sputtering phenomenon, P 14-P 17, University of Tokyo Press 1984). The elements on the left side in the periodic table have a low sputtering yield, which reveals that heavy metals are not difficult to be sputtered simply. This indicates that dissociation energy is high and atoms are not easily separated from each other at the time of sputtering, and thus they are difficult to be physically sputtered. However, the alkali metals and the alkaline earth metals on the leftmost side in the periodic table are too unstable as a simple substance, and thus they are not the metals for metallization.

Further, the incident angle dependence has been known that elements with a smaller atomic number have a higher sputtering yield at a high angle (Oechsner, Z. Physik, 261, 37, 1973). That is, the peak angle of the sputtering yield shifts to a low angle side as elements become heavy. As a result that this is associated with the shoulder-drop phenomenon, in a substance having the maximum value of the sputtering yield at a large angle place, the corner portions of a pattern are easily etched and therefore, the shoulder-drop becomes remarkable.

As a result of the above-described examination, the metallic elements on the lower left of the periodic table are conceived to be more suitable for suppressing the shoulder-drop. Concretely, the elements in the group 4 elements to the group 6 elements or so in the third period and after are conceived to be more suitable.

However, the affinity of these metallic elements for oxygen is not large. That is, precursors of these metals are difficult to be oxidized. Therefore, the precursors permeated to the organic film are not oxidized to be diffused into the outside of the organic film again, resulting in that the degree of metallization does not increase.

As a result of an earnest examination of this problem, the present inventors has found that a solution by the combination of the precursor and the polymer to be the forming material of the organic film is enabled.

A calculation is performed by using $AlCl_3$ in which the methyl group ($-CH_3$) of TMA is replaced with a chlorine atom (Cl) as an example below. The metal to be used is the same, which is aluminum (Al), and thus it is not effective for the shoulder-drop, but the reactivity of the precursor, which is an important point in this embodiment, can be simplified, thus making it possible to understand the mechanism.

As for TMA and $AlCl_3$ being a precursor of Al, the precursor forms a dimer, and thus a stabilization energy of the dimer and a stabilization energy after adsorption to the polymer are calculated. It is found out that the stabilization energy of the dimer of the precursor containing Cl is larger as compared to that of TMA and the value does not vary even when the number of Cl is one or three. Further, it is found out that precursors having both $CH_3$ and Cl certainly meet on the Cl side.

In contrast to this, it has found that the precursors having a large number of Cl are more stabilized after being adsorbed to the polymer. It is conceived that the dimer of the precursor having one piece or two pieces of Cl is stable and requires energy additionally for migration, thus failing to be adsorbed to the polymer. TMA and $AlCl_3$ are both conceived that the dimer is separated to be adsorbed to the polymer. A comparison between TMA and $AlCl_3$ reveals that $AlCl_3$ has a larger stabilization energy.

Further, $AlCl_3$ has a shorter distance between Al and a carbonyl group and has a larger change in an angle between Al and a ligand as compared to TMA. With these results, it is conceived that $AlCl_3$ is more strongly adsorbed to the polymer than Al. Then, in order to examine whether the adsorbed precursor turns into $AlO_x$ through an oxidation reaction, a HOMO (Highest Occupied Molecular Orbital) and a LUMO (Lowest Unoccupied Molecular Orbital) in a state of being adsorbed to the polymer is calculated. As a result, it is conceived that as for TMA, the HOMO leans to TMA and is easily attacked by an oxidant, while as for $AlCl_3$, there is no HOMO in $AlCl_3$, and thus the reactivity is low.

As above, from the result obtained by calculating the two of the methyl group and the chlorine atom as the ligand of the precursor of aluminum, it is expected that the Cl ligand is excellent in adsorption performance but is difficult to be oxidized in the case where Cl is a ligand. The examinations of metal species of the precursor conducted hitherto reveal that there is a problem that when $TiCl_4$ or $VCl_4$ is used as the precursor, the precursor is incorporated into the polymer but is difficult to turn into oxide.

HOMO structures of $TiCl_4$ and $VCl_4$ have been calculated. It is conceived that as for TMA, the HOMO in the precursor, and thus the oxidant is adsorbed electrophilically and the oxidation progresses. However, as for $AlCl_3$, $TiCl_4$, and $VCl_4$, after the absorption to the polymer, the HOMO is not localized in the precursor but is diffused to the polymer side. Therefore, the oxidant does not seem to approach the HOMO so as to come into contact therewith. A further examination of a deep level reveals that as for $AlCl_3$ and $TiCl_4$, a HOMO-2 in the precursor and a difference is 8.65 kcal/mol and 11.74 kcal/mol. The difference means a level where a reaction does not progress unless extra heat of about several 100° C. is applied. As for $VCl_4$, a HOMO-1 existed in the precursor and the difference is 2.89 kcal/mol, but $VCl_4$ has a complex electronic structure and may be adsorbed in a form of $VCl_3$ due to a spin, which requires a further argument.

From the above, it is conceived that in the case of Cl being a ligand, the precursor does not turn into oxide unless a stronger oxidant is used or a stronger oxidation condition is employed because an electron density after the adsorption is low.

As above, it is found out that even when being adsorbed to the polymer, the precursor has difficulty in turning into oxide in many cases because of low reactivity.

TMA, which is the precursor that has been examined generally so far, has high reactivity, and as soon as it is exposed to an oxidant after infiltration of the polymer therewith, it is oxidized immediately. TMA is easily oxidized by, for example, water as an oxidant even at a low temperature close to room temperature. TMA is rather oxidized easily, and thus it is immediately oxidized and immobilized and is no longer diffused into the polymer when a hydroxyl group or a carboxyl group exists in the polymer. As a result, the oxide of TMA stays on the surface, and thus the inside of the polymer is not metallized. Therefore, a conventional polymer is desired to have a molecular structure in which a hydroxyl group or a carboxyl group does not exist as much as possible so as not to react with the precursor. Thereby, the precursor does not cause a chemical reaction with the polymer and is permeated into the inside by physical diffusion. Finally, it is easily oxidized after being exposed to the oxidant and is immobilized on the spot, and thus it is metallized to the inside of the polymer.

In contrast to this, it became clear that the reactivity of the precursor used in this embodiment is lower than that of TMA, and therefore, an interaction with the polymer is completely different. The precursor used in this embodiment can be diffused into the polymer when being exposed to the polymer similarly to TMA. The thing mentioned until now is similar to that of TMA, but when exposure to the oxidant is performed thereafter to oxidize the precursor, a considerable part of the precursors remains unreacted because they are difficult to be oxidized. When it is taken out of a chamber in this state, it became clear that the unreacted precursors gradually volatilize from the polymer.

As a result of working for this problem, the present inventors found out that the problem is solved by introducing a group having reactivity with the precursor into the polymer. In the case where there is a reactive site, when entering the inside of the polymer, the precursor is oxidized to react and is immobilized there. In the case where the precursor is such a precursor to be easily oxidized as TMA, as soon as the precursor is exposed to the polymer and enters the inside, it reacts. As will be described later, however, the precursor that is difficult to be oxidized, which is used in this embodiment, is diffused into the polymer due to a low reaction probability. Then, it is stochastically oxidized to be immobilized in the internal reactive site. As a result, metallization to the inside of the polymer is enabled.

It is thought that when an easily-oxidizable precursor penetrates into the polymer having oxidation active group active group such as an OH group inside the polymer, for example, the precursor is oxidized in the vicinity of the surface of the polymer. Therefore, it is thought that the oxide accumulates in the vicinity of the surface to prevent permeation into the inside. However, in the case of a precursor that is difficult to be oxidized, the precursor is not immediately oxidized on the surface of the polymer, and thus permeation into the inside of the polymer is enabled in some degree.

Figure 3A:
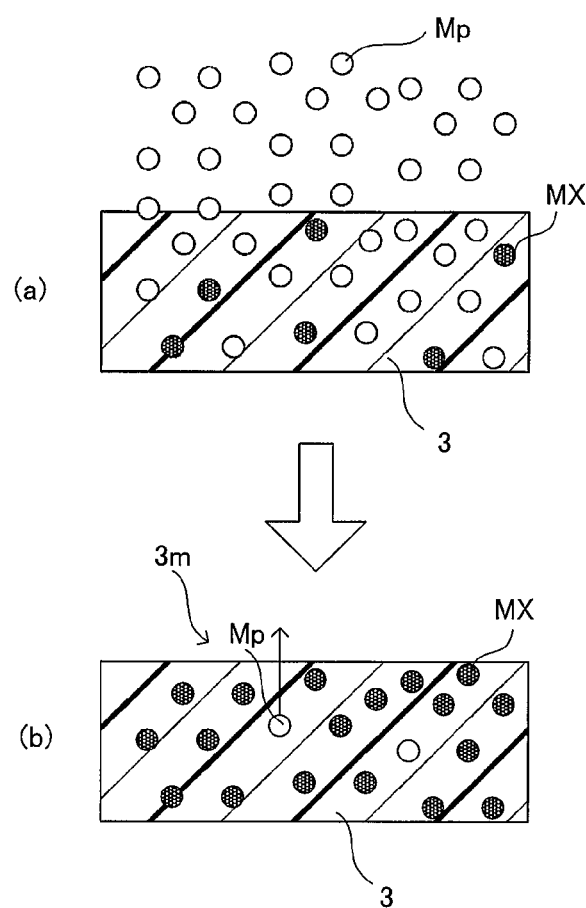
FIG. 3A is a view schematically illustrating metallization of a specific metallic compound to an organic film formed by using a polymer having oxidation activity.

There is illustrated a metallization state in the case where the precursor that is difficult to be oxidized enters an organic film formed with such a polymer having oxidation active group in FIG. 3A (a) and FIG. 3A (b). Further, as a comparison, in FIG. 3B (a) and FIG. 3B (b), there is illustrated a metallization state in the case where the precursor that is difficult to be oxidized enters an organic film formed with a polymer having no group having oxidation activity. There will be explained functions of the group having oxidation activity to the polymer (X) while using FIG. 3A (a) and FIG. 3A (b) and FIG. 3B (a) and FIG. 3B (b).

FIG. 3A (a) and FIG. 3A (b) each illustrate a cross-sectional view of the organic film 3 in the case where the precursor Mp is supplied to the organic film 3 formed with the polymer (X), and then an oxidant treatment is performed. FIG. 3A (a) illustrates a cross-sectional view of the organic film 3 when the precursor Mp is supplied to the organic film 3. As illustrated in FIG. 3A (a), when the precursor Mp is supplied to the organic film 3, the precursor Mp is diffused into the organic film 3 to be coordinated to the unshared electron pairs that the polymer (X) has in the organic film 3. Then, some of the precursors Mp coordinated to the unshared electron pairs are further oxidized by the group having oxidation activity contained in the polymer (X) at a predetermined ratio to turn into a metallic compound MX. Examples of the metallic compound MX include metal oxide and metal hydroxide. The metallic compound MX is preferably metal oxide.

In FIG. 3A (a) and FIG. 3A (b), the arrow illustrated between FIG. 3A (a) and FIG. 3A (b) indicates the oxidant treatment. That is, FIG. 3A (b) illustrates the composite film 3m obtained after the organic film 3 having both the precursors Mp and the metallic compounds MX in the film illustrated in FIG. 3A (a) is subjected to the oxidant treatment. The composite film 3m has a structure in which a few of the precursors Mp coordinated to the unshared electron pairs of the organic film 3 are not oxidized to remain intact, but most of them are oxidized to be coordinated to the unshared electron pairs of the organic film 3 as the metallic compound MX.

The remaining precursors Mp are desorbed outside the composite film 3m because coordinate bonds with the unshared electron pairs are cut with time. In FIG. 3A (b), the arrow drawn from the precursor Mp schematically indicates how the precursor Mp is desorbed from the composite film 3m. In the composite film 3m, a substantial amount of the metal M coordinated to the unshared electron pairs in the organic film 3 is contained as the metallic compound MX, namely, a desired degree of metallization is achieved, and thereby when etching is performed by using this as a mask, this has high etch resistance. Particularly, the occurrence of the shoulder-drop at an etching time can be reduced.

Figure 3B:
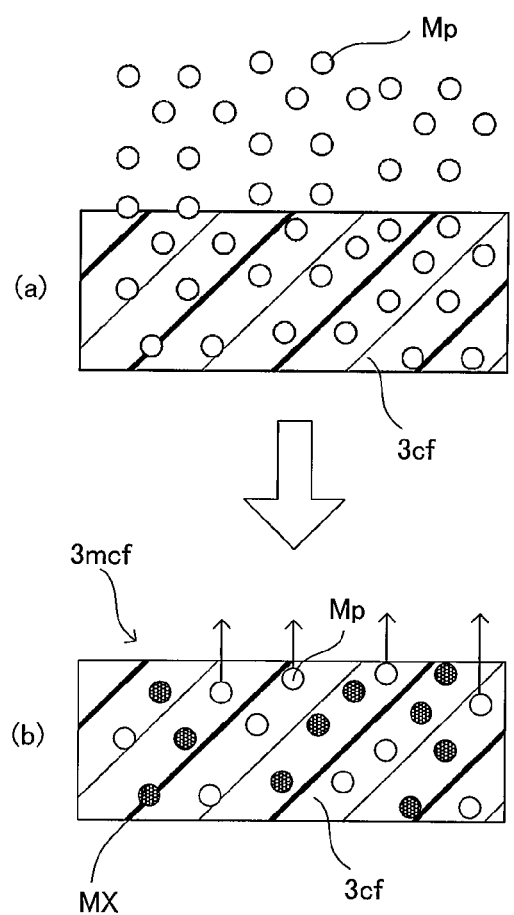
FIG. 3B is a view schematically illustrating metallization of a specific metallic compound to an organic film formed by using a polymer having no oxidizing ability.

FIG. 3B (a) and FIG. 3B (b) each illustrate a cross-sectional view of an organic film 3cf in the case where the precursor Mp is supplied to the organic film 3cf formed with a polymer that has the unshared electron pair at a side chain but does not have the group having oxidation activity, for example, and then an oxidant treatment is performed. FIG. 3B (a) illustrates a cross-sectional view of the organic film 3cf when the precursor Mp is supplied to the organic film 3cf. As illustrated in FIG. 3B (a), when the precursor Mp is supplied to the organic film 3cf, the precursor Mp is diffused into the organic film 3cf to be coordinated to the unshared electron pairs that the polymer (X) in the organic film 3cf has.

In FIG. 3B (a) and FIG. 3B (b), the arrow illustrated between FIG. 3B (a) and FIG. 3B (b) indicates the oxidant treatment similarly to FIG. 3A (a) and FIG. 3A (b). That is, FIG. 3B (b) in FIG. 3B (a) and FIG. 3B (b) illustrates a composite film 3mcf obtained after the organic film 3cf having the precursors Mp in the film illustrated in FIG. 3B(a) is subjected to the oxidant treatment. The composite film 3mcf has a structure in which the metallic compounds MX are partially coordinated to the unshared electron pairs of the organic film 3cf, but some of the precursors Mp coordinated to the unshared electron pairs of the organic film 3cf are not oxidized to remain intact. Then, the remaining precursors Mp are, similarly to the case of the composite film 3m, desorbed outside the composite film 3mcf because coordinate bonds with the unshared electron pairs are cut with time. The composite film 3mcf is in a state where the structures in which the metallic compound MX is coordinated to the unshared electron pair are only present sparsely in the film and the metallization is not sufficiently achieved.

The group having oxidation activity that the polymer (X) has is made of at least one selected from a carboxyl group, a hydroxyl group, a sulfo group, and a nitro group. As long as the polymer (X) contains these functional groups at predetermined ratios, as illustrated in FIG. 3A (a) and FIG. 3A (b), the composite film 3m whose degree of metallization is increased can be formed.

The group having oxidation activity contained in the polymer (X) at the above-described ratio does not need to be made of one kind, and may consists of two or more kinds. From the viewpoint of ease of manufacture of the polymer (X), the group having oxidation activity is preferably made of one kind. The carboxyl group or the hydroxyl group is preferred among the above.

The carboxyl group is oxidation active group and is a group having an unshared electron pair. Accordingly, in the case of having a carboxyl group at a side chain as the group having oxidation activity, the polymer (X) does not need to further have the unshared electron pair additionally. In the case of having the carboxyl group at a side chain, the polymer (X) further has an unshared electron pair other than the carboxyl group preferably.

In this case, the carboxyl group and the unshared electron pair other than the carboxyl group may exist in the same monomer unit, or may exist in different monomer units. That is, the polymer (X) may have the group having oxidation activity and the unshared electron pair in the same monomer unit, or may have the group having oxidation activity and the unshared electron pair in different monomer units. Further, the polymer (X) may have the group having oxidation activity and the unshared electron pair in the same side chain. In the monomer unit that has the group having oxidation activity at a side chain, the number of groups having oxidation activity may be one or two or more, and is preferably one.

Examples of the unshared electron pair that the polymer (X) has at a side chain include unshared electron pairs contained in a carbonyl group (>C═O:), a cyano group (—C≡N:), a pyridine skeleton, an amino group (—NH$_2$:), and so on. The unshared electron pair is preferably contained in the carbonyl group. The number of unshared electron pairs that the polymer (X) has is preferably, as an average number of pieces per monomer unit, 0.5 or more, more preferably 0.7 or more, and further preferably one or more because one segment may include two pieces. In the monomer unit that has the unshared electron pair at a side chain, the number of unshared electron pairs may be one or two or more, and in terms of molecular design, is preferably three or less and more preferably two or less.

The polymer (X) further has an aromatic ring at a side chain preferably in order to obtain a composite film having higher etch resistance, in particular, high reactive ion etching (RIE) resistance. Examples of the aromatic ring include a benzene ring, a naphthalene ring, an azulene ring, an anthracene ring, a chrysene ring, a pyrene ring, a coronene ring, a pentacene ring, and so on, and in terms of practicability and molecular design, the benzene ring is preferable. In the case where the polymer (X) has an aromatic ring at a side chain, the number of aromatic rings is preferably, as an average number of pieces per monomer unit, 0.5 or more, more preferably 0.8 or more, and further preferably one or more because two or more aromatic rings can be introduced into one segment. In the monomer unit that has the aromatic ring at a side chain, the number of aromatic rings may be one or two or more, and in terms of molecular design, is preferably three or less and more preferably two or less.

A stacked mask structure is sometimes employed in the mask pattern in order to achieve a processed shape having a high aspect ratio in the target film, for example. The composite film formed by the method in the embodiment, in particular, the composite film formed with the polymer (X)

having an aromatic ring at a side chain is suitably used as a base film that is formed between a resist film and the target film when it is used for the stacked mask structure.

Conventionally, in the stacked mask structure aiming at the high etch resistance, a diamond-like-carbon (DLC) layer has been used as the base film between the resist film and the target film. The composite film formed by the method in the embodiment, in particular, the composite film formed with the polymer (X) having an aromatic ring at a side chain has advantages that the material is low in price and easy film formation is enabled while having a function to be a replacement for the DLC layer that is extremely high in film formation cost.

For example, an aliphatic cyclic compound (alicycle) acrylic resin is normally used as a resin used for a photoresist film for argon fluoride excimer laser light (ArF light: wavelength of 193 nm) so as to secure transparency to the ArF light. However, when the composite film in which the organic film is metallized is used as a mask pattern, the composite film is used as the base film of the resist film in the above-described stacked mask structure, to thereby require no light transmittance, and a high absorption constant is rather required for antireflection.

In the case where the polymer (X) has an aromatic ring at a side chain, the monomer having the aromatic ring may be a monomer unit having the group having oxidation activity, a monomer unit having the unshared electron pair, or a monomer unit having the group having oxidation activity and the unshared electron pair. In the case where the polymer (X) has an aromatic ring at a side chain, in order to efficiently introduce the group having oxidation activity, the unshared electron pair, and the aromatic ring into the polymer (X), molecular design of the polymer (X) is preferably performed by using the monomer unit having a side chain containing two or more of the group having oxidation activity, the unshared electron pair, and the aromatic ring.

A structure of the main chain of the polymer (X) is not particularly limited. There is cited a polymer where a double bond of an ethylene group of a monomer having the ethylene group (>C=C<) is cloven to form the main chain of the polymer. In this case, as the monomer used for polymerization of the polymer (X), there are used a monomer where a group having the group having oxidation activity is bonded to either of carbon atoms of the ethylene group, a monomer where a group having the unshared electron pair is bonded to either of carbon atoms of the ethylene group, and a monomer where a group having both the group having oxidation activity and the unshared electron pair is bonded to either of carbon atoms of the ethylene group, for example. By using one or more of these three of the monomers, the polymer (X) that has the unshared electron pair at a side chain and contains the group having oxidation activity at the above-described predetermined ratio is designed.

In the case where the polymer (X) has the aromatic ring, as the monomer used for polymerization of the polymer (X), for example, in addition to the above-described three of the monomers, there are used a monomer where a group having the aromatic ring is bonded to either of carbon atoms of the ethylene group to be the main chain, a monomer where a group having both the aromatic ring and the unshared electron pair is bonded to either of carbon atoms of the ethylene group, a monomer where a group having both the group having oxidation activity and the aromatic ring is bonded to either of carbon atoms of the ethylene group to be the main chain, and a monomer where a group having the group having oxidation activity, the aromatic ring, and the unshared electron pair is bonded to either of carbon atoms of the ethylene group to be the main chain. By using one or more of these three of the monomers, the polymer (X) that has the unshared electron pair and the aromatic ring at a side chain and contains the group having oxidation activity at the above-described predetermined ratio is designed.

Even in each of the above-described monomers, a hydrogen atom or a methyl group is preferably bonded to a remaining bond of the ethylene group.

A component monomer of the monomer unit that the polymer (X) has preferably contains (meth)acrylic acid and its ester. The (meth)acrylic acid is a generic name for acrylic acid and methacrylic acid. (Meth)acrylate is a generic name for acrylate and methacrylate.

The main chain of the polymer (X) may have an ester skeleton and a novolac skeleton partially, and in the case, the main chain may have an aromatic ring.

As the monomer unit forming the polymer (X), for example, monomer units illustrated in Table 1 below are cited. Table 1 is a table in which in terms of the respective monomer units, the case of having the group having oxidation activity at a side chain, the case of having the aromatic ring at either a side chain or a main chain, and the case of having the unshared electron pair at a side chain are illustrated as a mark "○" and the case of not having the group having oxidation activity at a side chain, the case of not having the aromatic ring at either a side chain or a main chain, and the case of not having the unshared electron pair at a side chain are illustrated as a mark "x."

TABLE 1

| Monomer unit | Group having oxidation activity | Unshared electron pair | Aromatic ring |
| --- | --- | --- | --- |
| (A) | ○ | x | x |
| (B) | ○ | x | ○ |
| (C) | ○ | ○ | x |
| (D) | ○ | ○ | ○ |
| (E) | x | ○ | x |
| (F) | x | ○ | ○ |
| (G) | x | x | ○ |

The molecular design of the polymer (X) is performed by appropriately selecting the kind of the monomer unit from the above-described monomer units (A) to (G) and adjusting a molar ratio of the respective monomer units, for example, so as to obtain a structure in which the group having oxidation activity at a side chain is contained in the polymer (X) at a predetermined ratio, the unshared electron pair is contained at a side chain essentially, and the aromatic ring is contained at a side chain arbitrarily. Preferable existing ratios of the group having oxidation activity, the unshared electron pair, and the aromatic ring at a side chain in the polymer (X) are as described above.

The polymer (X) is preferably a copolymer (to be also referred to as a polymer (X1) hereafter) that alternately or randomly has at least one selected from the monomer units (A) to (D) (to be referred to as a "first monomer unit" hereafter) as the monomer unit having the group having oxidation activity at a side chain, (which may have the unshared electron pair), and at least one selected from the monomer units (E) and (F) (to be referred to as a "second monomer unit" hereafter) as the monomer unit having the unshared electron pair at a side chain, (which does not have the group having oxidation activity) concretely.

In the case of using the monomer units (C) and (D), the first monomer unit has the unshared electron pair at a side chain in addition to the group having oxidation activity, and thus the second monomer unit is not essential. In the polymer (X), a polymer containing the monomer unit (C) or (D) and containing neither the monomer unit (E) nor the monomer unit (F) is referred to as a polymer (X2) hereafter. The polymer (X1) is preferred because it can increase the degree of metallization as compared to the polymer (X2).

In the polymer (X1), one of each of the first monomer unit and the second monomer unit may be used, or two or more may be used. In the case where the first monomer unit has a single group having oxidation activity on average in the polymer (X1), the ratio of the first monomer unit to all the monomer units in the polymer (X1) is 30 mol % or more. Thereby, the existing ratio of the group having oxidation activity to the polymer (X1) can be 0.3 or more on average per monomer unit.

In the above, the ratio of the first monomer unit to all the monomer units in the polymer (X1) is preferably 50 mol % or more. The first monomer unit in the polymer (X1) preferably has the unshared electron pair and further has the aromatic ring preferably. That is, as the first monomer unit, the monomer units (C) and (D) are preferred and the monomer unit (D) is particularly preferred. Further, as the second monomer unit, a monomer unit having the aromatic ring is preferred, and concretely, the monomer unit (F) is preferred. As long as a monomer unit (F-3) that has two unshared electron pairs and two aromatic rings at a side chain per monomer unit is used as the monomer unit (F), the etch resistance of a composite film to be obtained can be increased effectively, which is more preferred.

The polymer (X) may have another monomer unit in addition to the first monomer unit and the second monomer unit that the polymer (X1) has. As another monomer unit, the monomer unit (G) is cited.

As the monomer unit (A), monomer units represented by chemical structural formulas (A-1) and (A-2) below are cited, for example. In the chemical structural formula (A-1), R represents a hydrogen atom or a methyl group. All pieces of R in the chemical structural formulas below have the same meaning. The monomer unit represented by the chemical structural formula (A-1) is referred to as a monomer unit (A-1) below. The other monomer units are also described similarly below. A part that is enclosed by square brackets "[ ]" in the chemical structural formula represents one monomer unit, and n represents a degree of polymerization. Hereinafter, [ ] and n each have the same meaning in the description of the polymer.

[Chemical structural formula 1]

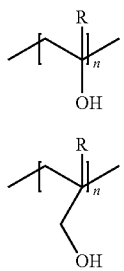

(A-1)

(A-2)

As the monomer unit (B), monomer units represented by chemical structural formulas (B-1) to (B-5) below are cited, for example. The monomer units (B-1) and (B-2) each are a monomer unit having an aromatic ring at a main chain, and the monomer units (B-3) to (B-5) each are a monomer unit having an aromatic ring at a side chain. For example, a monomer forming the monomer unit (B-3) is 4-hydroxystyrene or 4-hydroxy-α-methyl styrene.

In the monomer units (B-1) to (B-5), a bonding position of a hydroxy group may be any position of the aromatic ring. Further, in the monomer units (B-1) to (B-5), a monomer unit in which two or more, for example, two or three hydroxy groups are bonded to the aromatic ring may be employed. Further, as the monomer unit (B), a monomer unit having an aromatic ring other than those expressed by the monomer units (B-1) to (B-5) may be employed.

[Chemical structural formula 2]

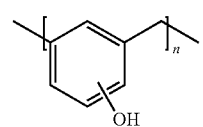

(B-1)

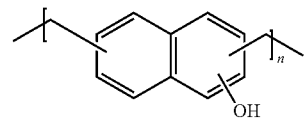

(B-2)

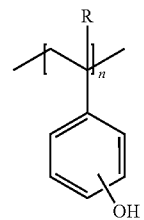

(B-3)

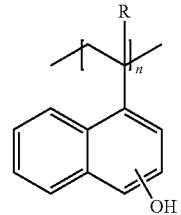

(B-4)

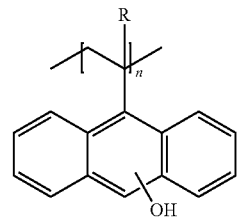

(B-5)

As the monomer unit (C), monomer units represented by chemical structural formulas (C-1) to (C-16) below are cited, for example. A monomer forming the monomer unit (C-1) is (meth)acrylic acid. Monomers forming the monomer units (C-2) to (C-16) are an ester of (meth)acrylic acid and an alicyclic compound having oxidation active group. For example, the monomer forming the monomer unit (C-4) is 1-hydroxy-1-adamantyl(meth)acrylate.

In the monomer units (C-2), (C-3), and (C-9) to (C-16), the position of the group having oxidation activity such as a hydroxy group or a carboxyl group may be any position of an alicycle. In the monomer units (C-4) to (C-8), the position of the group having oxidation activity to be bonded to an adamantane skeleton may be another position. Further, in the monomer units (C-2) to (C-16), a monomer in which two or more or three or more groups having oxidation activity are bonded to an alicycle may be employed. Further, as the monomer unit (C), a monomer unit having an alicycle other than those expressed by the monomer units (C-2) to (C-16) may be employed.

[Chemical structural formula 3]

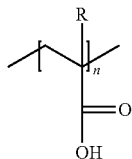
(C-1)

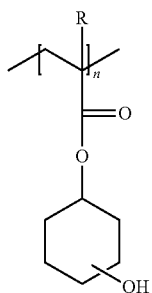
(C-2)

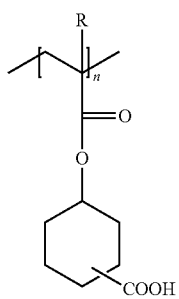
(C-3)

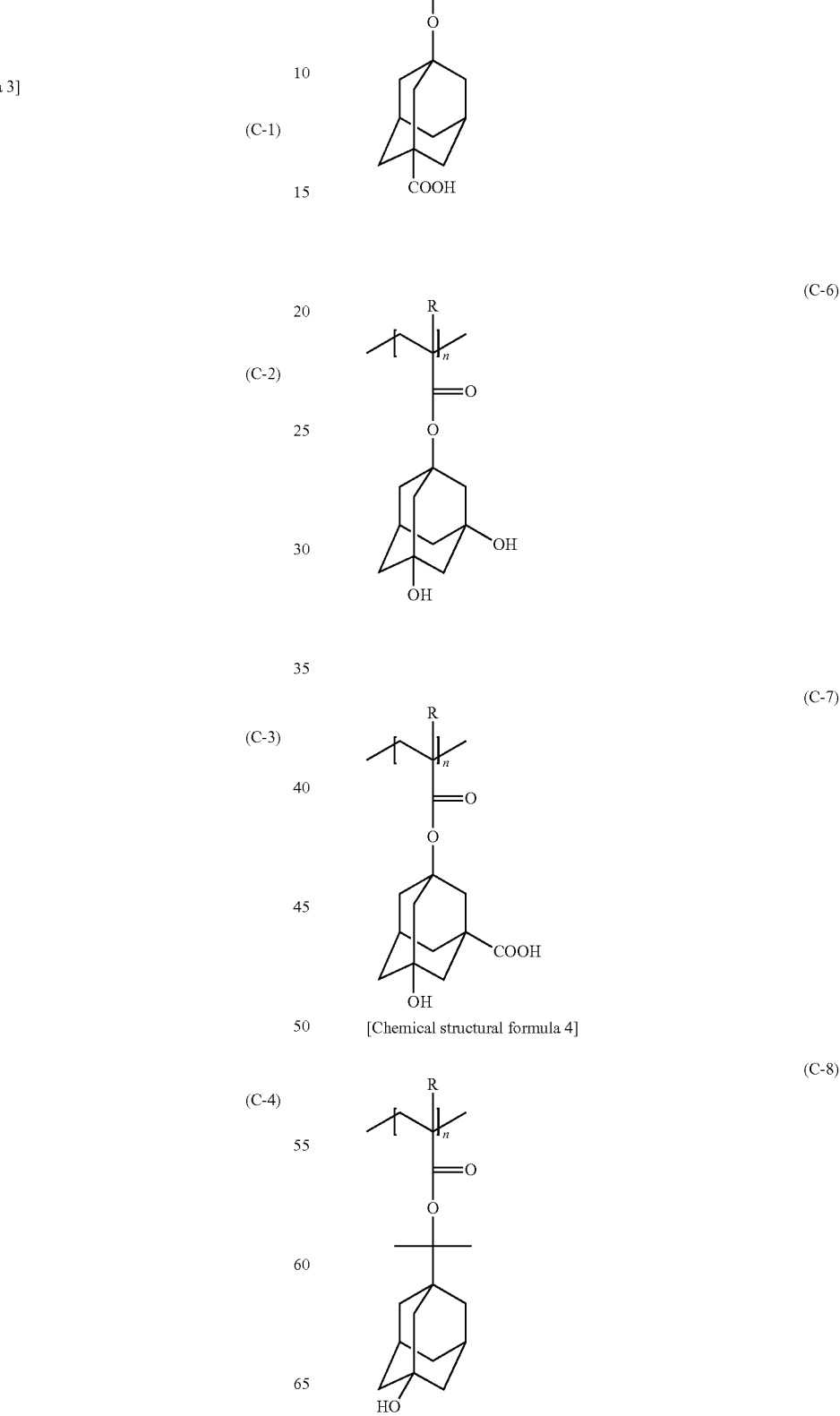

[Chemical structural formula 4]

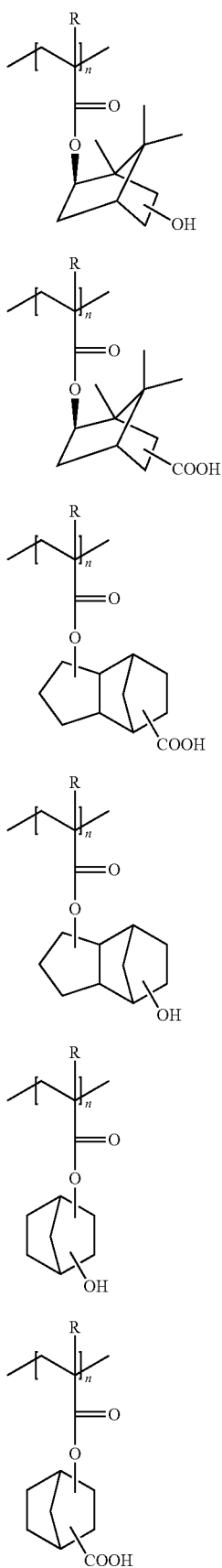

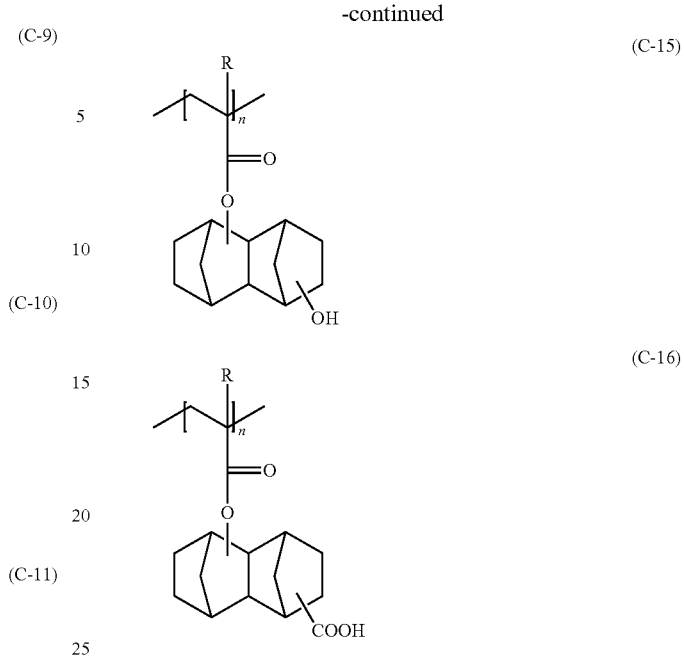

As the monomer unit (D), monomer units represented by chemical structural formulas (D-1) to (C-7) below are cited, for example. A monomer forming the monomer unit (D-1) is carboxylstyrene (benzoic acid) or carboxyl-α-methylstyrene, for example. The carboxyl group, the nitro group, and the sulfo group that the monomer units (D-1) to (D-7) have each are oxidation active group as well as having an unshared electron pair.

In the monomer units (D-1) to (D-7), a bonding position of the carboxyl group, the nitro group, the sulfo group, or the like may be any position of the aromatic ring. Further, in the monomer units (D-1) to (D-7), a monomer in which two or more, for example, two or three carboxyl groups, nitro groups, and sulfo groups are bonded to an aromatic ring may be employed. Further, as the monomer unit (D), a monomer unit having an aromatic ring other than those expressed by the monomer units (D-1) to (D-7) may be employed.

[Chemical structural formula 5]

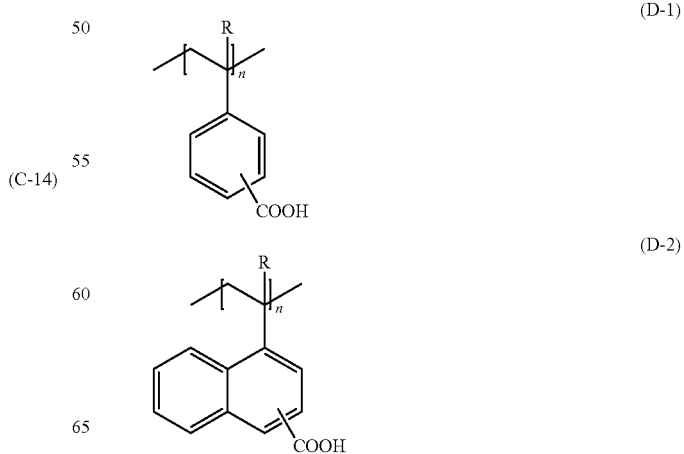

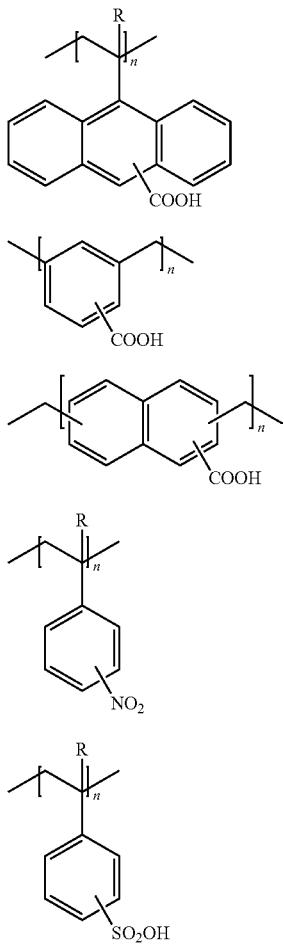

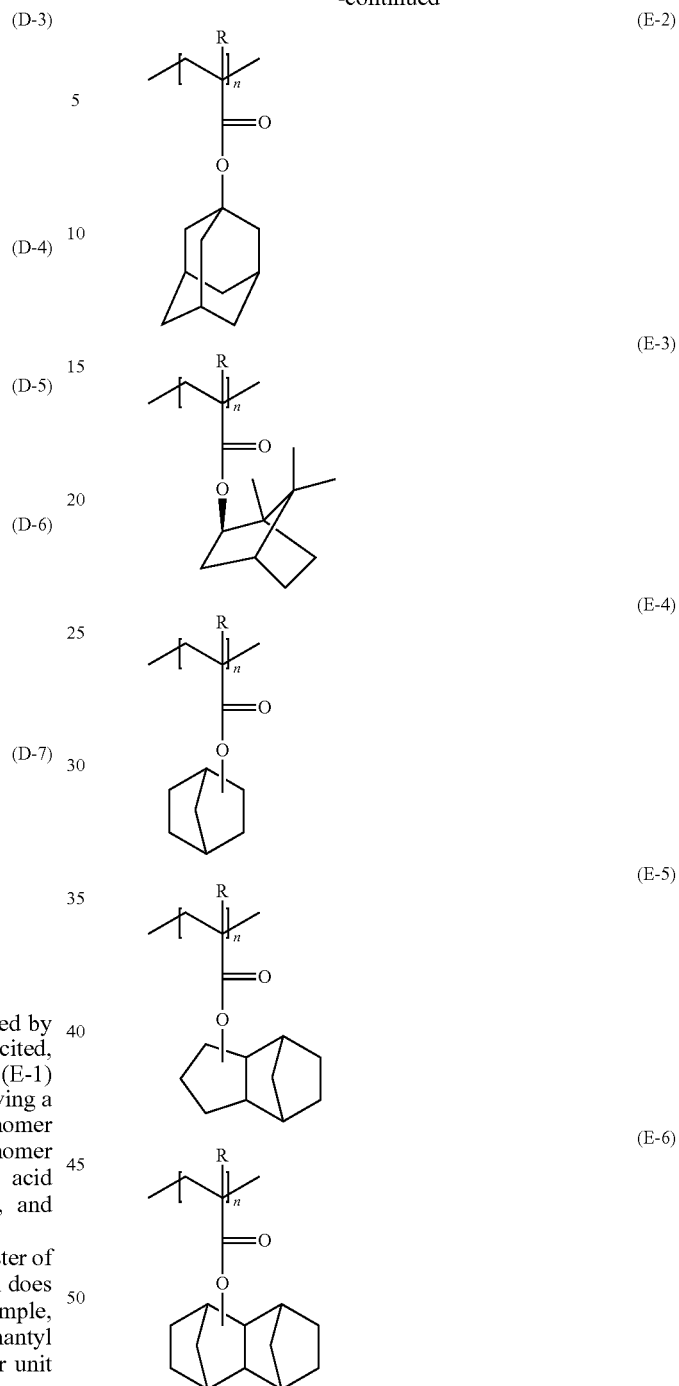

As the monomer unit (E), monomer units represented by chemical structural formulas (E-1) to (E-6) below are cited, for example. $R^1$ in the chemical structural formula (E-1) represents a branched or straight-chain alkyl group having a carbon number of 1 to 12. A monomer forming the monomer unit (E-1) is (meth)acrylic acid alkyl ester. As the monomer unit (E-1), (meth)acrylic acid methyl, (meth)acrylic acid ethyl, and (meth)acrylic acid propyl are preferred, and (meth)acrylic acid methyl is more preferred.

A monomer forming the monomer unit (E-1) is an ester of (meth)acrylic acid and an alicyclic compound, (which does not have the group having oxidation activity). For example, a monomer forming the monomer unit (E-2) is adamantyl (meth)acrylate. As the monomer unit (E), a monomer unit having an alicycle other than those expressed by the monomer units (E-2) to (E-6) may be employed.

[Chemical structural formula 6]

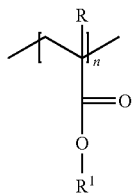

(E-1)

As the monomer unit (F), monomer units represented by chemical structural formulas (F-1) to (F-3) below are cited, for example. $R^2$ in the chemical structural formula (F-1) represents a branched or straight-chain alkyl group having a carbon number of 1 to 6. A monomer forming the monomer unit (F-1) is carboxylic acid 4-vinylphenyl or carboxylic acid 4-1-methylvinylphenyl. As the carboxylic acid, acetic acid in which $R^2$ is a methyl group, propionic acid in which $R^2$ is an ethyl group, butyric acid in which $R^2$ is a propyl group, and so on are cited, and the acetic acid is preferred.

$R^3$ in the chemical structural formula (F-2) is a single bond or an alkylene group having a carbon number of 1 to 4. A monomer forming the monomer unit (F-2) is phenyl (meth)acrylate or phenylalkyl(meth)acrylate ((meth)acrylic acid phenylalkyl). A monomer forming the monomer unit (F-4) is benzoylphenyl(meth)acrylate.

[Chemical structural formula 7]

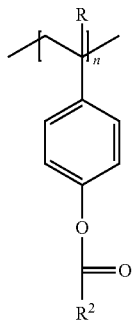

(F-1)

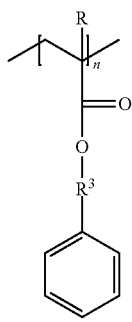

(F-2)

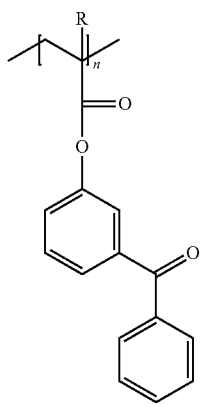

(F-3)

As the monomer unit (G), monomer units represented by chemical structural formulas (G-1) to (G-6) below are cited, for example. For example, a monomer forming the monomer unit (G-1) is styrene or a-methyl-styrene. Monomers forming the monomer units (G-2) and (G-3) are vinylnaphthalene, vinylanthracene or a-methyl-substituted vinylnaphthalene, vinylanthracene respectively. As the monomer unit (G), a monomer unit having an aromatic ring other than those expressed by the monomer units (G-1) to (G-6) may be employed.

[Chemical structural formula 8]

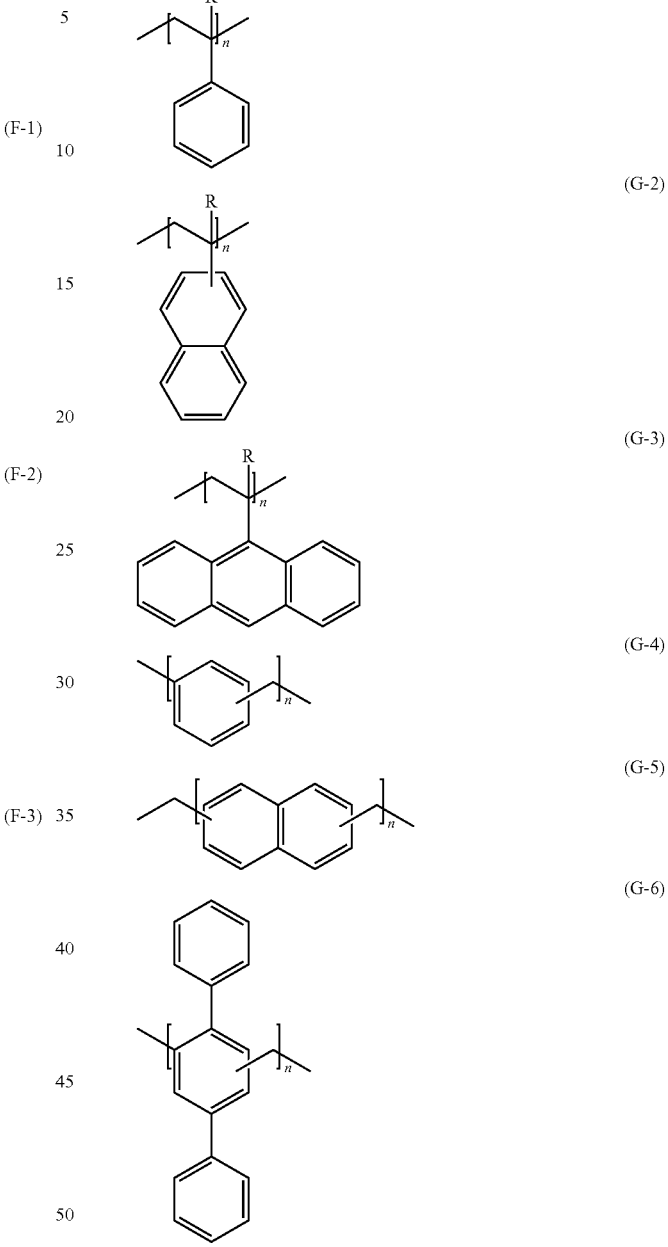

Manufacture of the polymer (X) can be performed by a normal method, for example, bulk polymerization, solution polymerization, emulsion polymerization, suspension polymerization, or the like by using component monomers of the monomer unit. In the case where the polymer (X) is synthesized by the solution polymerization, normally, predetermined monomers are dissolved in a polymerization solvent and polymerized under presence of a polymerization initiator. The monomers used for the manufacture of the polymer (X) include the component monomers of the first monomer unit and the component monomers of the second monomer unit in the case of the polymer (X1), for example. Polymerization conditions such as an amount of the polymerization solvent, a polymerization temperature, and a polymerization time are appropriately selected according to a kind of the monomer, a molecular weight of the polymer (X) to be synthesized, and so on.

A weight-average molecular weight (Mw) of the polymer (X) is preferably 10000 to 200000 [g/mol] (hereinafter, a unit may sometimes be omitted), more preferably 20000 to 100000, and particularly preferably 40000 to 80000. Mw of the polymer (X) can be measured by a gel permeation chromatography (GPC). Further, a glass transition temperature (Tg) of the polymer (X) is preferably 80 to 200° C. and more preferably 100 to 150° C. Tg of the polymer (X) can be measured by a differential scanning calorimeter (DSC).

The pattern forming material may contain components other than the polymer (X) as necessary within the range not impairing the effect of this embodiment in addition to the polymer (X). Examples of the component other than the polymer (X) include a curing agent and a curing accelerator representatively.

The polymer (X) has at least one selected from a carboxyl group, a hydroxyl group, a sulfo group, and a nitro group as the group having oxidation activity. These groups having oxidation activity are a reactive group, and when forming the organic film 3 with the pattern forming material, the polymers (X) may be crosslinked via the group having oxidation activity by using a curing agent as necessary. In this case, an added amount of the curing agent is adjusted so that 0.3 pieces or more of the groups having oxidation activity per monomer unit on average exist in a crosslinked product of the polymer (X) in the obtained organic film 3 by ratio.

As the curing agent, for example, a compound having two or more pieces of the group having oxidation activity and a group having reactivity is cited. Further, in the case of containing the polymer (X) and the curing agent, the pattern forming material may further contain the curing accelerator. The polymers (X) are crosslinked when forming the organic film 3 using the pattern forming material, leading to an increase in solvent resistance in the obtained organic film 3.

Examples of the components other than the polymer (X), the curing agent, and the curing accelerator contained in the pattern forming material include a photo-acid generator, a thermal acid generator, a photo-base generator, a thermal-base generator, a photo-radical generator, a thermal-radical generator, and so on. The content of the components other than the polymer (X) in the pattern forming material can be appropriately selected according to each component. The content of the components other than the curing agent, the curing accelerator, and the polymer (X) is preferably 20 weight % or less, more preferably 10 weight % or less, and further preferably 2% or less to the total content of the pattern forming material, and the components other than those are not contained particularly preferably.

The method of forming the organic film 3 with the pattern forming material may be a dry-coating method or a wet-coating method. When the organic film 3 is formed by the dry-coating method, the organic film 3 can be formed by the dry-coating method, for example, a vapor deposition method with the pattern forming material itself. In the case of forming the organic film 3 by the wet-coating method, a method of forming the organic film 3 is preferable in which a liquid composition containing the pattern forming material and a solvent is applied on the target film 2 on the base 10 and dried.

The solvent in the above-described liquid composition is not limited in particular as long as it is a solvent to dissolve the polymer (X) contained in the pattern forming material.

Examples of the solvent dissolving the polymer (X) include aromatic hydrocarbons such as toluene, xylene, and mesitylene, ketones such as cyclohexanone, acetone, ethylmethylketone, and methylisobutylketone, and cellosolves such as methylcellosolve, methylcellosolveacetate, ethylcellosolveacetate, butylcellosolveacetate, and propylene glycol monomethyl ether acetate (PGMEA), and cellosolves are preferable. A boiling point of the solvent is preferably 120° C. or more and 180° C. or less in consideration of film-formability at a coating time. Two or more of the solvents can be used in combination as necessary.

The content of the pattern forming material in the liquid composition is adjusted together with the condition at a coating time, for example, a rotation number by spin coating or the like according to a required film thickness. This makes it possible to finely form the organic film 3 on the substrate 10 by the wet-coating method.

A normal method is applicable as a method of applying the liquid composition on the substrate 10 by the wet-coating method. Concretely, spin coating and dip coating are preferable. Thereafter, the solvent is removed from a coating film of the liquid composition by drying, and thereby, the organic film 3 can be formed. When crosslinking the polymers (X) at the time of film forming of the organic film 3, a crosslinking process according to the polymer (X) and the curing agent contained in the pattern forming material, for example, heating or light irradiation is performed to enable crosslinking.

When the crosslinking is performed by heating, a heating temperature depends on a crosslinkable functional group, for example, the group having oxidation activity or a kind of the curing agent. The heating temperature is preferably about 120° C. or more, more preferably 160° C. or more, and further preferably 200° C. or more. However, the heating temperature is preferably less than 300° C. so as to suppress decomposition of a polymer main chain. In the case of the wet-coating method, drying, namely, removal of the solvent contained in the liquid composition is normally is performed together through this heating. The organic film 3 formed of the pattern forming material, or where the polymers (X) in the pattern forming material are crosslinked is thereby obtained.

Step (2)

The step (2) is a step of partially removing the organic film 3 on the target film 2 obtained by the step (1) and forming the organic film pattern 3p having the remaining portion as a pattern. The formation of the organic film pattern 3p, namely patterning of the organic film 3 is performed by a normal method. Concretely, the patterning of the organic film 3 can be performed by a method such that the portion to remain as a pattern is masked and the portion that is not masked is etched. The etching is performed by RIE, for example, while using an oxygen-based gas.

FIG. 2B illustrates a cross-sectional view of a stack obtained by patterning the organic film 3 on the target film 2 on the substrate 10 illustrated in FIG. 2A to the organic film pattern 3p.

Step (3)

The step (3) is a step of supplying a precursor to the patterned film obtained by the step (2). In the step (3), the precursor to be supplied to the organic film may be gas or liquid. In FIG. 2A to FIG. 2F, the step (3) is a step of supplying the precursor Mp to the organic film pattern 3p on the target film 2 by the method schematically illustrated in FIG. 2C. In FIG. 2C, the precursor Mp is supplied to the organic film pattern 3p in a gas state. FIG. 2C illustrates a state where the precursor Mp is supplied to the organic film pattern 3p to be adsorbed thereto. Therefore, in FIG. 2C, the organic film pattern 3p to which the precursor Mp is adsorbed (precursor Mp containing organic film pattern) is denoted by a sign of 3mp.

(Precursor)

The precursor is a metal complex in which a ligand is coordinated and bonded to a metal. In the precursor used for the method in the embodiment, the metal is the metal M with an atomic number of 22 or more in group 3 elements to group 13 elements. The metal M is a metal falling within the range, thereby making it possible to reduce the occurrence of shoulder-drop in the obtained mask pattern at an etching time. The metal M is preferred to be a metal with an atomic number of 77 or less from the viewpoint of sputtering resistance.

As the metal M, out of these metals, the metals in the group 4 elements to the group 6 elements are preferred and the metals in the group 4 elements are more preferred from the viewpoint of a magnitude of bond energy to an oxygen atom. As the metal M, concretely, titanium (Ti), tungsten (W), vanadium (V), hafnium (Hf), zirconium (Zr), tantalum (Ta), and molybdenum (Mo) are preferred, and Ti, Zr, and Hf in the group 4 elements, are more preferred.

The ligand in the precursor Mp is preferably a ligand having a nitrogen atom, an oxygen atom, and a halogen atom and having one or more structure portions in which one of these is directly bonded to the metal M. The ligand is preferred to be sufficiently small to such an extent that the metal M in the precursor Mp can be coordinated to an unshared electron pair derived from the polymer (X) in the organic film 3.

As the precursor Mp, it is possible to use the precursors Mp used for a chemical vapor deposition (CVD) method and an atomic layer deposition (ALD) method.

In the metallization in the embodiment, among general precursors for CVD and ALD, the precursor Mp having, as the metal, the metal with an atomic number of 22 or more in group 3 elements to group 13 elements (metal M) can be used. Examples of the precursors for CVD and ALD include Metal Halide, Metal Alkoxide, Metal Alkylamino, Metal Alkyl, Metal Amidinate, Metal β-diketonate, Metal Carbonyl, Metal Cyclopentadienyl, and so on. In the embodiment, among these precursors, the precursor whose metal is the metal M is usable.

In the metallization here, the precursor is required to exist in the polymer stably, and the stabilization energy AE is preferred to be large sufficiently. The precursor having a bulky ligand is difficult to be diffused in the polymer. More importantly, in the case of the ligand being bulky, the carbonyl group (the group having an unshared electron pair), which is a stabilization site in the polymer, or the like has difficulty in approaching the metal and the precursor is difficult to be stabilized and exist.

The present inventors have found out that with respect to the stabilization site of the polymer, stabilization is enabled when the metal of the precursor falls within a range of about 0.2 nm (K. Asakawa, et al., Microprocess and Nanotechnology Conference, 15A-4-3, 2018). Therefore, the ligand used for the metallization is selected from such a viewpoint.

Concretely, metal amidinate, metal β-diketonate, and metal cyclopentadienyl are sometimes difficult to be stabilized and exist in the polymer because the ligand is a hindrance thereto. In the embodiment, examples of the precursor Mp to be preferably used for the metallization include a metal halide of the metal M, a metal alkoxide of the metal M, a metal alkylamino of the metal M, a metal alkyl of the metal M, and a metal carbonyl of the metal M.

In the embodiment, among the precursors Mp usable for the metallization, the precursors Mp superior in reaction in response to the oxidation aiming at fixation in the polymer by the oxidation are preferable. That is, when the bond energy of the metal M and an atom adjacent to the metal M is too strong, an oxidation reaction does not easily progress. The metal alkyl is easily oxidized because its bond energy is weak.

From the viewpoint that the oxidation progresses moderately in response to the above-described oxidation reaction, as the precursor Mp, the metal halide, the metal alkoxide, the metal alkylamino, and the metal carbonyl of the metal M are preferred.

Concrete examples of the precursor Mp include $TiCl_4$, $WCl_6$, $VCl_4$, $HfCl_4$, $ZrCl_4$, $Ti[N(CH_3)_2]_4$, $Zr[N(CH_3)_2]_4$, $Hf[N(CH_3)_2]_4$, $Zr(OCH_3)_4$, $Hf(OCH_3)_4$, $Zr(OC(CH_3)_3)_4$, $Hf(OC(CH_3)_3)_4$, and so on. The precursor Mp may be one or two or more of these compounds.

The metallization of the organic film pattern 3p including the step (3) progresses as follows concretely in the case where the precursor Mp in a gas state is supplied. First, the stack obtained in the step (2) is placed in a container capable of being hermetically sealed, the gaseous precursor Mp is introduced into the container, and the container is hermetically sealed to make an atmosphere of the precursor Mp. Thereby, the precursor Mp enters the organic film pattern 3p. In this process, physical diffusion of the precursor Mp becomes a parameter.

Then, the precursor Mp is adsorbed to the unshared electron pair derived from the polymer (X) in the organic film pattern 3p by a coordinate bond to be held in the organic film pattern 3p stably.

After that, the precursor Mp is oxidized and then the composite film 3m in which the organic film pattern 3p is infiltrated with the metallic compound MX is obtained finally. The reactivity of the precursor Mp having the metal M, which is used in the method in the embodiment, is low and oxidation is difficult. When the oxidation of the precursor Mp held in the organic film pattern 3p is performed under a strong condition, for example, by using an oxidant with a strong oxidizing action, the organic film pattern 3p may deteriorate.

In the method in the embodiment, in the organic film pattern 3p, the group having oxidation activity derived from the polymer (X) exists at a predetermined ratio. Thereby, some of the precursors Mp adsorbed and held in the organic film pattern 3p are oxidized to turn into the metallic compound Mx in the step (3). Then, the remaining precursors Mp that are not oxidized can also be oxidized by using an oxidant with an oxidizing action that is weak enough not to impair the organic film pattern 3p. As explained above, FIG. 3A (a) and FIG. 3A (b) illustrate how the precursor Mp is changed into the metallic compound Mx in the organic film pattern 3p by the oxidation in the method in the embodiment. FIG. 3A (a) is equivalent to an enlarged cross-sectional view of the atmosphere including the precursor Mp containing organic film pattern 3mp in FIG. 2C and the precursors Mp near the precursor Mp containing organic film pattern 3mp.

In the meantime, when oxidization is performed on the precursors Mp adsorbed and held in the organic film pattern by using an oxidant with a weak oxidizing action in the case where the polymer forming the organic film pattern does not have the group having oxidation activity, it is conceived that a phenomenon in which the oxidation is not performed sufficiently and the precursors Mp in the organic film pattern that are not subjected to the oxidation are desorbed occurs as illustrated in FIG. 3B(a) and FIG. 3B(b).

In the step (3), the stack obtained in the step (2) is carried into a vacuum device, the organic film pattern 3p is exposed to the gaseous or liquid precursor Mp, and a heat treatment is performed at a temperature of 50° C. or more and less than 200° C. Setting the treatment temperature to 50° C. or more makes it possible to more securely infiltrate the polymer (X) of the organic film pattern 3p with molecules of the precursor Mp. The treatment temperament is set to less than 200° C., thereby making it possible to adsorb the molecules of the precursor Mp to the unshared electron pair that the polymer (X) of the organic film pattern 3p has, for example, the unshared electron pair that the carbonyl group has.

The pressure in the vacuum device can be adjusted appropriately in the above. The pressure is preferably 10 to 3000 Pa and more preferably 30 to 1000 Pa. The pressure is made to fall within the above-described range, thereby making it possible to efficiently adsorb the molecules of the precursor Mp to the unshared electron pair that the polymer (X) of the organic film pattern 3p has, for example, the unshared electron pair that the carbonyl group has.

Step (4)

The step (4) is a step of supplying an oxidant to the organic film to which the precursor Mp is supplied in the step (3). In FIG. 2A to FIG. 2F, the step (4) is a step of supplying an oxidant Ox to the precursor Mp containing organic film pattern 3mp on the target film 2 by the method schematically illustrated in FIG. 2D. In FIG. 2D, the oxidant Ox is supplied to the precursor Mp containing organic film pattern 3mp in a gaseous state. FIG. 2D illustrates a state where the precursor Mp in the precursor Mp containing organic film pattern 3mp is oxidized to turn into the metallic compound MX. Therefore, in FIG. 2D, the organic film pattern 3p containing the metallic compound MX, namely the composite film as the mask is denoted by the sign of 3m.

In the step (4), the precursor Mp containing organic film pattern 3mp is exposed to the oxidant Ox, to thereby oxide the precursor Mp in the precursor Mp containing organic film pattern 3mp. The oxidant Ox is an oxidant with an oxidizing action that does not impair the organic film as above, and examples thereof include water, ozone, oxygen plasma, and so on.

The step (4) can be performed in the vacuum device after the above-described step (3), for example. Concretely, after the step (3), the redundant precursor Mp may be exhausted from the vacuum device and the oxidant Ox may be supplied thereto instead. The temperature from the step (3) to the step (4) varies according to the magnitude of the bond energy between an atom of the metal M and an adjacent atom in the precursor Mp, but is preferably about 80 to 300° C. and more preferably about 100 to 200° C. As for the condition of the temperature, a low-temperature side is defined by a reaction temperature of the oxidant and the precursor Mp and an upper-limit side is defined by a heatproof temperature of the polymer.

In the step (4), the pressure in the vacuum device can be adjusted appropriately. The pressure is preferably 50 to 3000 Pa and more preferably 200 to 1000 Pa. A low-pressure side of the pressure is defined by the diffusion of the precursor Mp into the polymer and an upper-limit side of the pressure is defined by a saturation value of the precursor Mp in the polymer. The pressure is made to fall within the above-described range, thereby making it possible to efficiently oxidize the precursors Mp in the precursor Mp containing organic film pattern 3mp. The oxidation of the precursor Mp may be performed spontaneously by moisture in an atmosphere without operation in particular.

The example where the organic film pattern 3p is metallized in a gas phase is described in the above, but the embodiment is not limited to this. The organic film pattern 3p may be metallized in a liquid phase.

By the step (3) and the step (4), the polymer (X) forming the organic film pattern 3p is metallized and the mask pattern 3m made of the composite film composed of the organic film and the metallic compound is made. FIG. 2E illustrates a cross-sectional view of the stack in which the mask pattern 3m made of the composite film is placed on the target film 2 on the substrate 10. FIG. 3A (b) is equivalent to an enlarged cross-sectional view of the mask pattern (composite film) 3m in FIG. 2E.

The mask pattern 3m obtained in this manner is used for processing a lower layer of the mask pattern 3m by etching or the like. FIG. 2F illustrates a state where the target film 2 being the lower layer of the mask pattern 3m has been processed by etching, for example, through the mask pattern 3m. According to the method in the embodiment, the target film can be processed into a pattern having a high aspect ratio due to having high etch resistance. Furthermore, in the mask pattern 3m, the occurrence of the shoulder-drop caused by etching is suppressed, and thus highly accurate processes can be performed on the target film 2.

In the above-described embodiment, the mask pattern 3m is formed on the semiconductor substrate 1, but the embodiment is not limited to this. The mask pattern can be formed on substrates of glass, quartz, mica, and so on in addition to the semiconductor substrate of silicon or the like.

(A Method of Manufacturing a Semiconductor Device)

A method of manufacturing a semiconductor device of an embodiment includes the following steps (A) to (D).

Step (A): A step of forming an organic film on a target film of a semiconductor substrate having the target film by using a pattern forming material Step (B): A step of patterning the organic film obtained in the step (A)

Step (C): A step of supplying a precursor of a metallic compound to the patterned film and obtaining a mask pattern in which the organic film is infiltrated with the metallic compound Step (D): A step of processing the target film by using the mask pattern In the method in the embodiment, the pattern forming material used in the step (A) contains the polymer (X). Further, the precursor of the metallic compound used in the step (C) contains a metal with an atomic number of 22 or more in group 3 elements to group 13 elements, and the precursor is oxidized to obtain the above-described metallic compound. Further, in the step (C), the mask pattern in which the organic film is infiltrated with the metallic compound may be obtained by further performing a process of supplying an oxidant to the organic film after the precursor of the metallic compound is supplied to the patterned film.

As the pattern forming material used in the method in the embodiment, the pattern forming material explained in the above-described pattern forming method in the embodiment is applicable, and as the precursor of the metallic compound, the precursor Mp explained in the above-described pattern forming method in the embodiment is applicable.

The method in the embodiment will be explained below by using FIG. 4A to FIG. 4E. FIG. 4A to FIG. 4E are cross-sectional views each illustrating one step of the method according to the embodiment. In the method in the embodiment, the steps proceed in a sequence of FIG. 4A to FIG. 4E.

Figure 4A:
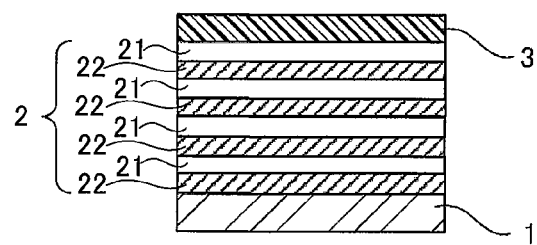
FIG. 4A is a view illustrating one example of a method of manufacturing a semiconductor device according to the embodiment.

FIG. 4A is a cross-sectional view schematically illustrating the step (A), namely the step of forming the organic film on the target film of the semiconductor substrate having the target film by using the pattern forming material. In this embodiment, an organic film 3 is formed of the pattern forming material to process a target film 2 formed on a semiconductor substrate 1.

In the step (A), first, the semiconductor substrate 1 on which the target film 2 is formed is prepared. The target film 2 may be a single layer film such as a silicon oxide film or may be a stacked film forming a three-dimensional memory cell array such as a NAND-type flash memory, or the like. In the example illustrated in FIG. 4A, the target film 2 is a stacked film in which nitride films 21 and oxide films 22 are alternately stacked.

In the step (A), the method of forming the organic film on the target film 2 of the semiconductor substrate 1 by using the pattern forming material is equivalent to the step (1) in the method in the embodiment, and the same method as the above-described step (1) is applicable. When the pattern forming material is applied on the target film 2 of the semiconductor substrate 1, the pattern forming material itself is applied in the case of the dry-coating method such as vapor deposition, for example. In the case of the wet-coating method such as spin coating or dip coating, a liquid composition containing the pattern forming material and a solvent is applied. Then, drying to remove the solvent and heating or light irradiation for crosslinking are performed as necessary, and the organic film 3 is formed on the target film 2.

Figure 4B:
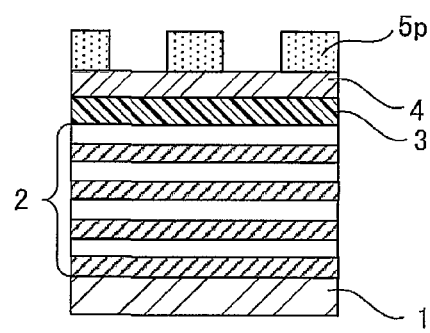
FIG. 4B is a view illustrating one example of a method of manufacturing a semiconductor device according to the embodiment.
Figure 4C:
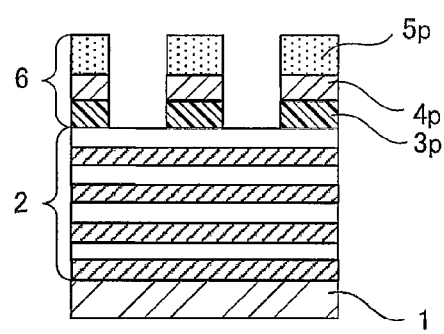
FIG. 4C is a view illustrating one example of a method of manufacturing a semiconductor device according to the embodiment.

FIG. 4B and FIG. 4C are cross-sectional views each schematically illustrating the step (B), namely the step of patterning the organic film 3 obtained in the step (A). As illustrated in FIG. 4B and FIG. 4C, the organic film 3 functions as a base layer of a stacked mask structure 6. FIG. 4B illustrates a state where a silicon oxide film 4 is formed on the organic film 3 as a functional film on which the patterning is performed and a resist pattern 5p is formed thereon.

The silicon oxide film 4 is formed by, for example, heating a spin on glass (SOG) film formed on the organic film 3 by the following method at a predetermined temperature of, for example, 150 to 350° C. SOG film is generally formed by applying a wet-coating solution made by dissolving a siloxane component in an organic solvent on the organic film 3 by spin coating.

At this time, a not-illustrated antireflection film may be formed on the silicon oxide film 4. The antireflection film prevents reflection from a base when a resist film formed by the following process is patterned and enables precision exposure.

Then, the resist film is formed on the silicon oxide film 4, and the resist film is made into the resist pattern 5p by using a lithography technology, an imprinting technology, or the like. In the imprinting technology, resist is dropped on the silicon oxide film 4, a template where a fine pattern is formed is pressed onto the resist film and is irradiated with ultraviolet rays to cure the resist film, and thereby, the resist pattern 5p is formed.

FIG. 4C is a cross-sectional view illustrating a state obtained after the silicon oxide film 4 is etched while using the resist pattern 5p as a mask to form a silicon oxide film pattern 4p, and further the organic film 3 is etched while using the resist pattern 5p and the silicon oxide film pattern 4p as a mask to form the organic film pattern 3p. The etching of the silicon oxide film 4 is performed by using a fluorine-based gas, and the etching of the organic film 3 is performed by using an oxygen-based gas. As illustrated in FIG. 4C, a structure in which the organic film pattern 3p, the silicon oxide film pattern 4p, and the resist pattern 5p are stacked in this order is one example of the stacked mask structure 6.

In the case where an antireflection film is formed on the silicon oxide film 4, the antireflection film is patterned prior to the etching of the silicon oxide film 4. A film thickness of the resist pattern 5p may be adjusted so that the resist pattern 5p disappears after the silicon oxide film pattern 4p is formed. Further, a film thickness of the silicon oxide film pattern 4p may be adjusted so that the silicon oxide film pattern 4p disappears after the organic film pattern 3p is formed.

In the case where the organic film pattern 3p is formed by the stacked mask structure 6 as illustrated in this embodiment, the silicon oxide film pattern 4p and the resist pattern 5p being upper layers of the organic film pattern 3p are removed before the step (C).

The step (C) is a step of metallizing the organic film pattern 3p after the step (B), namely, a step in which the precursor Mp being the precursor of the metallic compound is supplied to the patterned film (organic film pattern) 3p, and then a process of supplying an oxidant to the organic film pattern 3p is arbitrarily performed to obtain the mask pattern 3m made of the composite film in which the organic film pattern 3p is infiltrated with the metallic compound MX.

Figure 4D:
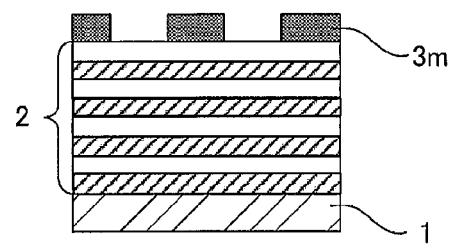
FIG. 4D is a view illustrating one example of a method of manufacturing a semiconductor device according to the embodiment.

FIG. 4D is a cross-sectional view illustrating a state after the step (C), in which the organic film pattern 3p illustrated in FIG. 4C is metallized to exist on the target film 2 on the semiconductor substrate 1 as the mask pattern 3m. The step (C), namely the step of metallizing the organic film pattern 3p is equivalent to the step (3) and the arbitrary step (4) of the method in the embodiment, and the same methods as the above-described step (3) and the arbitrary step (4) are applicable.

Figure 4E:
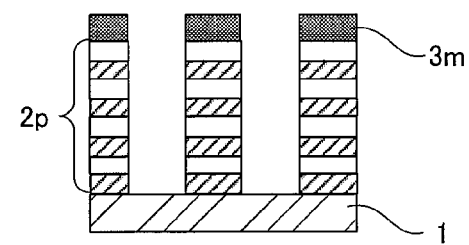
FIG. 4E is a view illustrating one example of a method of manufacturing a semiconductor device according to the embodiment.

Then, by the step (D), the mask pattern 3m is used as a mask, the target film 2 is etched by RIE or the like, and a patterned target film 2p is formed as illustrated in FIG. 4E. On this occasion, the degree of the shoulder-drop of the mask pattern 3m is small, and thereby, the target film 2p having a process shape with a high aspect ratio can be formed.

Thereafter, for example, a memory cell array is formed by using an already known method. For example, it is assumed that a hole pattern is formed on the stacked film by the above-described processes. A memory structure can be formed by embedding a block layer, a charge storage layer, a tunnel layer, a channel layer, and a core layer in such a hole. Thereafter, only the nitride films of the stacked film are removed through a slit that is formed separately from the hole pattern having the memory structure, and a conductive film is embedded instead. Thereby, the stacked film in which insulating films (the oxide films) and the conductive films are alternately stacked is formed. It is possible to make the conductive films in the stacked film function as a word line.

In the method in the above-described embodiment, the structure mainly having the organic film 3, the silicon oxide film 4, and the resist pattern 5p is described as the stacked mask structure, but the embodiment is not limited to this. Various structures can be employed as the stacked mask structure by inserting various films in addition to the above or deleting some of the above-described films.

According to the methods in the embodiment, the composite film in which the organic film is infiltrated with the metallic compound MX containing the metal with an atomic number of 22 or more in group 3 elements to group 13 elements is set as a mask pattern, thereby making it possible to obtain a mask pattern having high etch resistance. The mask pattern has high etch resistance and is capable of reducing the occurrence of the shoulder-drop, and thereby imparting a process shape having a high aspect ratio to the target film is enabled. Further, according to the methods in the embodiment, even in the case where the precursor Mp being the precursor of the metallic compound MX is used for the organic film obtained by the pattern forming material containing the polymer (X) that has the unshared electron pair at a side chain and has the group having oxidation activity for the precursor at a side chain at a predetermined ratio, sufficient metallization is enabled.

According to the methods in the embodiment, the organic film can be formed by a method such as spin coating, dip coating, or vapor deposition, and the composite film in which the organic film is infiltrated with the metallic compound can also be formed in a short period of time. For example, a carbon deposit layer and a DLC layer using a conventionally used CVD method need a long time for their film formation, but according to the methods in the embodiment, the composite film having high etch resistance can be formed easily in a short period of time.

In the methods in the embodiment, crosslinking the polymers when forming the organic film makes the obtained organic film difficult to be dissolved in an organic solvent. Thereby, it is possible to form an upper layer film such as a functional film or its precursor film on the organic film by application, dropping, or the like of a wet-coating solution. At this time, mixing between the organic film and the upper layer film or the precursor film can be suppressed. Examples of the upper layer film or the precursor film include a SOC (spin on carbon) film, a TEOS (tetraethyl orthosilicate) film, a resist film, and so on in addition to the above-described SOG film, and flexibility of design of the stacked mask structure dramatically increases.

EXAMPLES

There will be explained examples below. In the examples, the following polymers were prepared as the pattern forming material forming the organic film. Further, as the precursor, the following precursors were prepared.

(Polymer)

Methyl methacrylate (MMA) and acrylic acid (AC) were copolymerized at each ratio illustrated in Table 2 to obtain random copolymers of MMA and AC (polymers X-1 to X-5) and a homopolymer of MMA (polymer X-6). Molecular weights and Tg of the obtained polymers are illustrated in Table 2. The polymers X-1 to X-3 each are a polymer complying with the method in the embodiment.

TABLE 2

| Polymer Number | Monomer Kind | Ratio [mol %] | Monomer Kind | Ratio [mol %] | Average Number of Groups | Molecular Weight [kg/mol] | Tg [° C.] |
|---|---|---|---|---|---|---|---|
| X-1 | MMA | 50 | AC | 50 | 0.5 | 12 | 103 |
| X-2 | MMA | 60 | AC | 40 | 0.4 | 13 | 104 |
| X-3 | MMA | 70 | AC | 30 | 0.3 | 14 | 105 |
| X-4 | MMA | 80 | AC | 20 | 0.2 | 15 | 105 |
| X-5 | MMA | 90 | AC | 10 | 0.1 | 15 | 105 |
| X-6 | MMA | 100 | — | 0 | 0 | 15 | 105 |

(Precursor Mp Containing the Metal M)

As the precursor Mp, $TiCl_4$, $VCl_4$, $Hf[N(CH_3)_2]_4$ (TDMAH), and $Zr[N(CH_3)_2]_4$ (TDMAZ) were prepared.

(Precursor Containing Metal Other than the Metal M)

As the precursor other than the precursor Mp, $AlCl_3$ and trimethylaluminum (TMA) were prepared.

Examples 1 to 12

The above-described polymer and precursor were combined as illustrated in Table 3 and by the following method, a composite film was formed on a silicon (Si) substrate to be evaluated.

Each of the polymers was used as the pattern forming material, and a PGMEA solution or a cyclohexanone solution (liquid composition) containing 10% weight of the polymer by ratio was prepared. The obtained PGMEA solution was applied on the Si substrate by a spin coating method, drying at 100° C. was performed for 600 seconds, an organic film having a thickness of about 500 nm was formed, and an organic-film-attached Si substrate was obtained. The film thickness of the organic film on each of the organic-film-attached Si substrates was measured by using an atomic force microscope (AFM). The film thicknesses of the organic film and the composite film were measured by using the AFM below.

Then, a metallization process was performed on the obtained organic film. The organic-film-attached Si substrate was heated by using an atomic layer deposition (ALD) film-forming apparatus. In the case of the precursor being TMA, the Si substrate was heated to 100° C., and in the case of the precursor being $TiCl_4$, the Si substrate was heated to 150° C. Once a vacuum was drawn, and then each of the precursors was introduced and exposure was performed for 600 seconds. Once a vacuum was drawn to 0.2 Pa, and then in the atmosphere at 100° C., immediately, exposure to water as an oxidant was performed at 200 Pa for 200 seconds, and oxidation was performed. A sample, which is the metallized organic film obtained in this manner, namely, a composite-film-attached Si substrate in which the organic film on the organic-film-attached Si substrate was metallized to be a composite film was taken out of the ALD apparatus into the air.

(Film Thickness Change)

Immediately after the composite-film-attached Si substrate was taken out of the ALD apparatus (immediately after the metallization), the film thickness of the composite film was measured. Further, the film thickness of the composite film was measured after the composite-film-attached Si substrate was taken out of the ALD apparatus to be left to stand in the air for one day (one day later after the metallization). A film thickness change (an increased amount) [nm] from the organic film between the composite film immediately after the metallization and the composite film one day later after the metallization was found. Results are illustrated in Table 3.

TABLE 3

| Example | Polymer Number | Film Thickness Of Organic Film (nm) | Precursor kind | Composite Film (metallized organic film) | | | |
|---|---|---|---|---|---|---|---|
| | | | | Immediate film thickness (nm) | Immediate film thickness increased film ratio (%) | Film thickness one day later (nm) | Increased film ratio one day later (%) |
| 1 | X-1 | 517 | TiCl$_4$ | 562 | 8.7 | 558 | 7.9 |
| 2 | X-2 | 512 | | 566 | 10.5 | 551 | 7.6 |
| 3 | X-3 | 537 | | 593 | 10.4 | 574 | 6.9 |
| 4 | X-4 | 484 | | 539 | 11.4 | 501 | 3.5 |
| 5 | X-5 | 471 | | 545 | 15.7 | 481 | 2.1 |
| 6 | X-6 | 482 | | 561 | 16.4 | 486 | 0.8 |
| 7 | X-1 | 517 | TMA | 520 | 0.6 | 522 | 1.0 |
| 8 | X-2 | 512 | | 525 | 2.5 | 524 | 2.3 |
| 9 | X-3 | 537 | | 545 | 1.5 | 543 | 1.1 |
| 10 | X-4 | 484 | | 525 | 8.5 | 524 | 8.3 |
| 11 | X-5 | 471 | | 558 | 18.5 | 559 | 18.7 |
| 12 | X-6 | 482 | | 585 | 21.4 | 588 | 22.0 |

From the above results, in the case of TMA being used as the precursor, existence of the carboxyl group having oxidation activity in the organic film prevented entrance of Al and suppressed a film thickness increase caused by adsorption of Al. It is conceived that the reaction finished immediately after the metallization because TMA was easily oxidized by water, and therefore, no change was seen in the film thickness even one day later. This is conceivably because TMA is oxidized by a large number of carboxyl groups having oxidation activity present in molecules of the polymer, and thus TMA is oxidized to form an oxide film on the surface of the polymer, thereby making following TMA impossible to be diffused.

In the case of TiCl$_4$ being used as the precursor, the film thickness increased immediately after the metallization regardless of the presence or absence of the carboxyl group. In contrast to this, it is found out that the film thickness decreased one day later. Due to poor reactivity, TiCl$_4$ requires a high reaction temperature, but is still not oxidized easily only by water. Therefore, it is conceived that TiCl$_4$ exists as it is in a volatile state to then volatilize. Actually, changes in color of the film immediately after the metallization are observed, which suggests that TiCl$_4$ has volatilized (see FIG. 3B (a) and FIG. 3B (b)).

However, the film thickness change immediately after the metallization and the film thickness change one day later after the metallization are seen to find out that the film thickness change immediately after the metallization is smaller in the polymer containing a large number of the carboxyl groups having oxidation activity. Further, a comparison is made between the film thickness of the organic film before the metallization and the film thickness of the organic film after the metallization to reveal that the film thickness increase one day later is larger in the polymer containing a large number of the carboxyl groups having oxidation activity. This result reveals that the effect is exhibited when it is about 10 mol %, and the degree of metallization increases when it is 30 mol %. This reveals that in the case of a precursor having low reactivity such as TiCl$_4$, more metallization is performed in the polymer into which oxidation active group is introduced (see FIG. 3A (a) and FIG. 3A (b)).

Examples 13 to 26

The above-described polymer and precursor were combined as illustrated in Table 4 and by the following method, a composite film was formed on a silicon (Si) substrate to be evaluated. As the film forming method and the measuring method of each polymer, the same methods as those in Table 3 were used. Then, a metallization process was performed on each of obtained organic films by the same method as that in Table 3. Each substrate temperature at a metallization process time is as illustrated in Table 4.

(Film Thickness Change)

In the same manner as in Examples 1 to 12, the film thickness of the organic film on an organic-film-attached Si substrate was measured. Further, immediately after a composite-film-attached Si substrate was taken out of the ALD apparatus (immediately after the metallization), the film thickness of a composite film was measured. Further, the film thickness of the composite film was measured after the composite-film-attached Si substrate was taken out of the ALD apparatus to be left to stand in the air for one day (one day later after the metallization). Results are illustrated in Table 4.

(Metal Distribution)

In the composite film of the composite-film-attached Si substrate after one day or more elapsed since the metallization, the distribution of metal in the depth direction was examined by X-ray photoelectron spectroscopy with Ar sputtering. The examined metal is a metal of a metallic compound obtained by oxidation of the precursor.

(Etch Resistance)

Each organic-film-attached Si substrate (each composite-film-attached Si substrate) after one day or more elapsed since it was metallized as above was subjected to reactive chemical etching (RIE) using O$_2$ gas or CF$_4$ gas. Further, in order to measure sputtering resistance, it was subjected to ion beam etching (IBE) at an incidence angle of 60°. Film thicknesses of the composite film of each of the composite-film-attached Si substrates were measured by using an atomic force microscope (AFM) before and after the etching, and an etching rate per etching time [nm/sec] was calculated while using a difference between the film thicknesses before and after the etching as an etching amount.

Results are illustrated in Table 4.

(1) O$_2$RIE

O$_2$RIE was performed by using CI-300L (manufactured by Samco Inc.), under the conditions of power: 50 W, bias 5 W, Flow: 5 sccm, and pressure: 3 Pa.

(2) CF$_4$RIE

CF$_4$RIE was performed by using CI-300L, under the conditions of power: 50 W, bias 10 W, Flow: 5 sccm, and pressure: 3 Pa.

(3) IBE 60°

IBE (ion beam etching) was performed by using Millatron8C (Commonwealth Scientific), under the conditions of 2.0×10$^{-6}$ Torr and acceleration voltage of 250 V.

(Shoulder-Drop Measurement)

From each polymer material illustrated in Table 4, an organic-film-attached Si substrate was fabricated similarly to the above, and on each organic film, a pattern of 100 nm line/100 nm space was fabricated. Thereafter, by using each precursor illustrated in Table 4, metallization was performed by the same method as above. RIE was performed on an obtained composite film pattern (mask pattern) at 15 m Torr of a mixed gas of C$_4$F$_6$/O$_2$/N$_2$/Ar, at a high bias of 5500 W, and for 60 seconds. A cross section of the pattern obtained by cracking a wafer was observed by a SEM and a cross-sectional photograph of the SEM was observed visually to evaluate the degree of shoulder-drop according to the following criteria. Results are illustrated in Table 4.

<Evaluation Criteria>

◎; A chip of an upper side corner portion of the pattern is less than 30% of a diameter and a bottom portion has no dimensional change ○; A chip of an upper side corner portion of the pattern is 30% or more of a diameter, but a bottom portion has no dimensional change Δ; An upper side corner portion of the pattern is chipped and a bottom portion has 10% or more dimensional change X; An upper corner portion of the pattern is chipped and a defect caused by shoulder-drop goes down to a bottom portion

TABLE 4

| Example | Polymer material | Precursor | Metal | Metallization temperature ° C. | Film thickness of organic film or composite film (nm) | | | Metal distribution in composite film | Etching rate (nm/sec) | | | Shoulder-drop |
|---|---|---|---|---|---|---|---|---|---|---|---|---|
| | | | | | Organic film | Immediately after metallization | One day later after metallization | | $O_2$ RIE | $CF_4$ RIE | IBE 60° | |
| 13 | X-1 | TMA | Al | 100 | 517 | 520 | 522 | Only surface | 0.44 | 0.86 | 1.66 | × |
| 14 | | $AlCl_3$ | Al | 100 | 517 | 560 | 551 | Gradual decrease from surface | 0.055 | 0.61 | 1.77 | × |
| 15 | | $TiCl_4$ | Ti | 150 | 517 | 552 | 545 | Uniform distribution | 0.06 | 0.66 | 1.74 | ○ |
| 16 | | $VCl_4$ | V | 150 | 517 | 558 | 548 | Uniform distribution | 0.045 | 0.46 | 1.51 | ○ |
| 17 | | TDMAH | Hf | 200 | 517 | 538 | 536 | Uniform distribution | 0.02 | 0.41 | 0.87 | ◎ |
| 18 | | TDMAZ | Zr | 200 | 517 | 540 | 538 | Uniform distribution | 0.022 | 0.51 | 0.95 | ◎ |
| 19 | X-6 | TMA | Al | 100 | 482 | 585 | 588 | Uniform distribution | 0.082 | 0.64 | 1.81 | × |
| 20 | | $AlCl_3$ | Al | 100 | 482 | 571 | 495 | Uniform distribution | 0.062 | 0.66 | 1.82 | × |
| 21 | | $TiCl_4$ | Ti | 150 | 482 | 558 | 490 | Almost none | 0.088 | 0.71 | 1.91 | × |
| 22 | | $VCl_4$ | V | 150 | 482 | 537 | 488 | Almost none | 0.086 | 0.69 | 1.88 | × |
| 23 | | TDMAH | Hf | 200 | 482 | 525 | 520 | Gradual decrease from surface | 0.024 | 0.43 | 0.91 | Δ |
| 24 | | TDMAZ | Zr | 200 | 482 | 520 | 518 | Gradual decrease from surface | 0.029 | 0.59 | 1.08 | Δ |

The above results reveal that in the case of using TMA or $AlCl_3$ as the precursor, an improvement in resistance to the etching by $CF_4$RIE or IBE is small. This is conceivably because in the case of light metal such as Al, a high angle incident rate is fast for sputtering at a high bias, resulting in the occurrence of shoulder-drop. In contrast to this, they reveal that $TiCl_4$, $VCl_4$, TDMAH, TDMAZ, and so on are resistant to the etching by $CF_4$RIE or IBE and are more resistant to the shoulder-drop as compared to Al. However, in the case of the polymer material being X-6, a metal retention ratio was low and the degree of metallization was small. In contrast to this, they reveal that in the case of X-1, a metallization ratio is high, and thus the resistance to the etching by $CF_4$RIE or IBE improves to reduce the shoulder-drop.

While certain embodiments have been described, these embodiments have been presented by way of example only, and are not intended to limit the scope of the inventions. Indeed, these embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern, comprising:
   forming an organic film on a substrate with a pattern forming material;
   patterning the organic film to form a patterned film; and
   supplying a precursor of a metallic compound to the patterned film to form a mask pattern of the patterned film infiltrated with the metallic compound,
   wherein:
   the precursor is oxidized in the patterned film to form the metallic compound;
   the material contains a polymer having a side chain, the side chain including an unshared electron pair and a group having oxidation activity to the precursor;
   the group includes at least one group selected from the group consisting of a carboxyl group, a hydroxyl group, a sulfo group, and a nitro group;
   an average number of the groups per monomer unit is 0.3 or more; and
   the metallic compound contains a metal with an atomic number of 22 or more in the group 3 elements to the group 13 elements.

2. The method according to claim 1, wherein
the metallic compound contains a metal in the group 4 elements in the periodic table.

3. The method according to claim 1, wherein
the precursor contains at least one compound selected from the group consisting of metal halide, metal alkoxide, metal alkylamino, and metal carbonyl, the at least one compound containing the metal.

4. The method according to claim 1, further comprising:
supplying an oxidant to the patterned film after the supply of the precursor to the organic film.

5. A method of manufacturing a semiconductor device, comprising:
forming an organic film on a target on a semiconductor substrate with a pattern forming material;
patterning the organic film;
supplying a precursor of a metallic compound into the patterned film to form a mask pattern of the patterned film infiltrated with the metallic compound; and
processing the target using the mask pattern,
wherein:
the precursor is oxidized in the patterned film to form the metallic compound,
the material contains a polymer a side chain, the side chain including an unshared electron pair and a group having oxidation activity to the precursor,
the group includes at least one group selected from the group consisting of a carboxyl group, a hydroxyl group, a sulfo group, and a nitro group,
an average number of the groups is 0.3 or more per monomer unit, and
the metallic compound contains a metal with an atomic number of 22 or more in the group 3 elements to the group 13 elements.

6. The method according to claim 5, wherein
the metal of the metallic compound is a metal in the group 4 elements.

7. The method according to claim 5, wherein
the precursor contains at least one selected from metal halide, metal alkoxide, metal alkylamino, and metal carbonyl of the metal.

8. The method according to claim 5, further comprising:
supplying an oxidant to the organic film after the supply of the precursor to the organic film.

* * * * *

UNITED STATES PATENT AND TRADEMARK OFFICE
CERTIFICATE OF CORRECTION

PATENT NO. : 11,393,671 B2
APPLICATION NO. : 16/816478
DATED : July 19, 2022
INVENTOR(S) : Koji Asakawa et al.

It is certified that error appears in the above-identified patent and that said Letters Patent is hereby corrected as shown below:

On the Title Page

Item (74), in the Attorney, Agent, or Firm, Line 2, "Dunner L.L.LP." should read --Dunner, L.L.P.--.

Item (57), Line 9, "one group selected the group" should read --one group selected from the group--.

In the Claims

In Claim 5, Column 38, Line 1, "contains a polymer a side chain," should read --contains a polymer having a side chain,--.

Signed and Sealed this
Fourteenth Day of February, 2023

Katherine Kelly Vidal
*Director of the United States Patent and Trademark Office*